(12) United States Patent
Sakamoto et al.

(10) Patent No.: US 6,459,121 B1
(45) Date of Patent: Oct. 1, 2002

(54) METHOD FOR PRODUCING NON-VIOLATILE SEMICONDUCTOR MEMORY DEVICE AND THE DEVICE

(75) Inventors: Osamu Sakamoto; Naoki Tsuji; Satoshi Shimizu, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 5 days.

(21) Appl. No.: 09/621,533

(22) Filed: Jul. 21, 2000

(30) Foreign Application Priority Data

Jan. 5, 2000 (JP) .......................... 2000-000327

(51) Int. Cl.[7] ........................................... H01L 29/788
(52) U.S. Cl. .................... 257/315; 257/317; 257/321; 438/257
(58) Field of Search .................. 257/315, 317, 257/321; 438/257, 264, 265; 365/185.01, 185.1, 185.26

(56) References Cited

U.S. PATENT DOCUMENTS

| 5,023,680 | A | * | 6/1991 | Gill et al. ................... 257/317 |
| 5,278,438 | A | * | 1/1994 | Kim et al. ................... 257/316 |
| 5,622,881 | A | * | 4/1997 | Acocella et al. ............. 438/264 |
| 5,879,998 | A | * | 3/1999 | Krivokapic ................. 438/300 |
| 5,923,063 | A | * | 7/1999 | Liu et al. .................... 257/316 |
| 6,114,204 | A | * | 9/2000 | Ding et al. ................. 438/264 |
| 6,200,856 | B1 | * | 3/2001 | Chen ......................... 438/257 |
| 6,232,635 | B1 | * | 5/2001 | Wang et al. ................ 257/318 |
| 6,255,689 | B1 | * | 7/2001 | Lee ............................ 257/314 |
| 6,284,597 | B1 | * | 9/2001 | Hong ........................ 438/257 |

FOREIGN PATENT DOCUMENTS

| JP | 2-151074 | 6/1990 |
| JP | 11-195717 | 7/1999 |

OTHER PUBLICATIONS

K. Shimizu et al., A Novel High–Density 5F2 Nand STI Cell Technology Suitable for 256Mbit and 1Gbit Flash Memories, IEEE, IEDM 97, pp. 271–74.*

* cited by examiner

Primary Examiner—George C. Eckert, II
(74) Attorney, Agent, or Firm—McDermott, Will & Emery

(57) ABSTRACT

A method for producing a non-volatile semiconductor memory device, comprising the steps of providing a semiconductor substrate having a surface; forming trench isolations on the substrate, the trench isolations being projected from the surface; forming source and drain regions between the neighboring trench isolations, so that the source and drain regions are faced each other across a channel region; and forming a floating gate electrode on the channel region through a tunnel film which is formed on the channel region.

18 Claims, 19 Drawing Sheets

METHOD FOR PRODUCING NON-VIOLATILE SEMICONDUCTOR MEMORY DEVICE AND THE DEVICE

BACKGROUND OF THE INVENTION

The present invention relates to a non-volatile semiconductor memory device and, more particularly, to a non-volatile semiconductor memory device which has a self-aligned floating gate electrode formed by using a trench isolation structure and a method for producing the same.

FIGS. 16A to 18I show steps for producing a conventional non-volatile semiconductor memory device. As shown in FIG. 16A, linear trench isolations 2 are formed on a surface of a silicon semiconductor substrate by using a conventional technology. Then, the surface of the semiconductor substrate 1 is oxidized, thereby a tunnel film 3 made from silicon oxide is formed on the substrate 1. A polycrystalline silicon layer is deposited and a floating gate electrode 4 is formed from the polycrystalline layer using a lithography technology. The floating gate 4 extends linearly and parallel to the trench isolations 2. Then, n type ions are implanted into the substrate 1, thereby $n^-$ diffusion layers 5 are formed parallel to the trench isolations 2.

Then, as shown in FIG. 16B, an insulating film made from silicon oxide is deposited over the top surface of the semiconductor substrate 1. The insulating film is then partially etched and remained on side walls of the floating gate electrodes 4 and, thereby, side spacers 6 are formed. Then, $n^+$ diffusion layers 7 are formed parallel to the trench isolations 2 by an ion implantation technology.

Then, as shown in FIG. 16C, thick insulating layer 8' having a thickness of about 5000–8000 Å is formed over the top surface of the semiconductor substrate 1.

Also, as shown in FIG. 17D, the thick insulating layer is polished so that the top of the floating gate electrode 4 is exposed by CMP method, thereby flat insulating layers 8 are formed.

Further, as shown in FIG. 17E, a polycrystalline silicon layer is deposited over the surface of the semiconductor substrate 1, and the polycrystalline silicon layer is etched to form fin-type floating gate electrodes 9. The fin-type floating gate electrodes 9 extend linearly and parallel to the floating gate electrodes 4.

Furthermore, as shown in FIG. 17F, an inter poly insulating film 10 is formed on the fin-type floating gate electrodes 9 and flat insulating layers 8. For example, the inter poly insulating film 10 is made from a multi-layer film (an ONO film) of silicon oxide, silicon nitride and silicon oxide films or a multi-layer film (an ONON film) of silicon oxide, silicon nitride, silicon oxide and silicon nitride films.

Then, a two-layer film 11 of conducting and insulating layers is deposited on the inter poly insulating film 10. Subsequently, as shown in FIG. 18G, illustrating a cross sectional view of a region with a word line, the two-layer film used for a control electrode 11 is remained. On the other hand, as shown in FIG. 18H, indicating a cross sectional view of a region without such a word line, the two-layer film is removed.

Further, as shown in FIG. 18I, the inter poly insulating films 10, the fin-type floating gate electrodes 9 and the floating gate electrodes 4 are removed in the region without the word line.

Then, a non-volatile semiconductor memory device shown in FIGS. 19A to 19C is completed. Note that FIG. 19A is a plan view of the non-volatile semiconductor memory device. Also, FIG. 19B is a cross sectional view of the region with a word line (along lines A—A), and FIG. 19C is a cross sectional view of the region without a word line (along lines B—B).

The non-volatile semiconductor memory shown in FIGS. 19A to 19C comprises $n^-$ diffusion layers 5 and $n^+$ diffusion layers 7 extending parallel to the trench isolations 2, and forming source/drain regions of memory cells. Hereinafter, the source and drain regions are referred to as a source and the drain lines, respectively. These lines are called as bit lines of a memory device. While the control electrode 11 is formed perpendicular to the trench isolation 2, and the line is called as a word line of a memory device.

An equivalent circuit diagram of the non-volatile semiconductor memory is shown in FIG. 20. In the diagram, the circuit comprises n pieces of memory cell, and memory cells 1 to n−1 are in write mode, and memory cell n is in erase mode. When reading information stored in the memory cell n, the drain line is biased to about 1V, the source line to 0V, the semiconductor substrate to 0V, the word lines 1 to n−1 to 0V and the word line n to about 5 V as shown in FIG. 20.

However, the floating gate electrodes 4 may be formed out of the center of the two neighboring trench isolations 2, after these isolations 2 has been formed at the alignment step for the trench isolations 2. Therefore, the floating gate electrode 4 can often be shifted from the center of the isolations 2.

In FIG. 19B, when the floating gate electrode 4 is shifted from the center to the right, widths of the $n^-$ diffusion layer 5 and $n^+$ diffusion layer 7 formed at the right side of the floating gate electrode 4 are smaller than those of the $n^-$ diffusion layer 5 and $n^+$ diffusion layer 7 formed at the left side of the electrode 4. This results in that the resistance of the right drain line is higher than that of the left source line.

When the resistance of the drain line is higher than that of the source line, a voltage drop is occurred in the drain line. This presents the drain part of the memory cell n from being biased to 1V, although the drain line is biased to 1V. This in turn that the current flowing through the memory cell n becomes lower than Iread flowing in memory cell n at erase mode, therefore the memory cell n is erroneously detected to be in write mode.

Also, when misalignment of the floating gate electrode 4 against the center of the trench isolations 2 increases the resistance of the source or drain. Therefore, the length between the neighboring trench isolations 2 should be three times or more of the minimum resolution (F) using in lithography process. This results in that the unit memory cell 20 is 2 F long by 4 F wide and 8 $F^2$ in area in minimum.

Further, as shown in FIG. 18I, an etching residue 12 in the shadow portion of the side spacer 6 after the removal of the floating gate electrode 4 in the portion where no word line is formed may connect electrically between the floating gate electrodes 4 of the neighboring memory cells.

SUMMARY OF THE INVENTION

Accordingly, the first object of the present invention is to provide a non-volatile semiconductor memory device which detects information in write/erase mode of the memory cell with a certain precision by forming a floating gate electrode at the center of the neighboring trench isolations.

Also, the second object of the present invention is to provide a highly integrated non-volatile semiconductor memory device which comprises a memory cell smaller than 8 $F^2$ in area.

Also, the third object of the present invention is to provide a non-volatile semiconductor memory device which prevents a short-circuit between memory cells by removing etching residues on a side wall of a side spacer.

The present invention provides a method for producing a non-volatile semiconductor memory device. The method includes the steps of providing a semiconductor substrate having a surface, forming trench isolations on the substrate, the trench isolations being projected from the surface, forming source and drain regions between the neighboring trench isolations, so that the source and drain regions are faced each other across a channel region, and forming a floating gate electrode on the channel region through a tunnel film which is formed on the channel region.

By forming the floating gate electrode after forming the source/drain regions, the floating gate electrode can be formed at the center of the neighboring trench isolations, so that the width of the source region is substantially equal to that of the drain region and, thereby, resistance of the source region is substantially equal to that of the drain region. This prevents the malfunction of reading information from a memory cell.

Also, the present invention provides a method, wherein the step of forming source and drain regions comprising the steps of forming an oxide film comprising conductive impurities over the surface of the semiconductor substrate in which the trench isolations will be formed, etching the oxide film to form self-aligned side spacers on the side walls of the trench isolations, the side spacers being made from the oxide film remained on the side walls, and diffusing the impurities from the side spacers into the semiconductor substrate below the side spacers to form diffusion layers adjacent to the trench isolations, the diffusion layers becoming source and drain regions.

By forming the source/drain regions using the self-aligned side spacers, the floating gate electrode can be formed at the center of the neighboring trench isolations.

Also, the present invention provides a method, wherein the step of forming source and drain regions comprising the steps of forming a first oxide film comprising conductive impurities over the surface of the semiconductor substrate in which the trench isolations will be formed, etching the first oxide film to form self-aligned first side spacers on the side walls of the trench isolations, the first side spacers being made from the first oxide film remained on the side walls, forming a second oxide film comprising conductive impurities of which concentration is lower than that of the first oxide film over the top surface of the semiconductor substrate, etching the second oxide film to form self-aligned second side spacers on side walls of the first side spacers, the second side spacers being made from the second oxide film remained on the first side spacers, and diffusing the impurities from the first and second side spacers into the semiconductor substrate below the first and second side spacers to form high concentration diffusion layers adjacent to the trench isolations and low concentration diffusion layers adjacent to the first diffusion layers, the first and second diffusion layers becoming source and drain regions.

By forming the source/drain regions using the self-aligned side spacers, the floating gate electrode can be formed at the center of the neighboring trench isolations.

Also, by using the producing method, a memory cell having a LDD structure can be formed and, thereby, a memory cell having high reliability can be obtained.

Also, the present invention provides a method, wherein the step of forming source and drain regions comprising the steps of implanting impurities of first conduction type into the semiconductor substrate between the trench isolations to form a first conductive region, forming an oxide film over the semiconductor substrate, etching the oxide film to form self-aligned side spacers on the side walls of the trench isolations, the side spacers being made from the oxide film remained on the side walls, and implanting impurities of second conduction type into the semiconductor substrate using the side spacers for masks, so that the first conductive region in which the impurities of second conduction type are implanted becomes the channel region of second conductive type, while the first and second conductive regions facing to each other across the channel region become the source and drain regions.

By forming the source/drain regions using the self-aligned side spacers, the floating gate electrode can be formed at the center of the neighboring trench isolations.

Also, the present invention provides a method, wherein the step of forming source and drain regions comprising the steps of implanting impurities of first conduction type into the semiconductor substrate between the trench isolations to form a first conductive region, forming a first oxide film over the semiconductor substrate, etching the first oxide film to form self-aligned first side spacers on the side walls of the trench isolations, the first side spacers being made from the first oxide film remained on the side walls, implanting impurities of second conduction type into the semiconductor substrate using the first side spacers for masks, so that the first conductive region in which the impurities of second conduction type are implanted becomes a second conductive region, the second conductive region comprising impurities of first conductive type of which concentration is lower than that of the first conductive region, forming a second oxide film over the semiconductor substrate, etching the second oxide film to form self-aligned second side spacers on the side walls of the first side spacers, the second side spacers being made from the second oxide film remained on the side walls of the first side spacers, and implanting impurities of second conduction type into the semiconductor substrate using the second side spacers for masks, so that the second conductive region in which the impurities of second conduction type are implanted becomes the channel region of second conductive type, while the first and second conductive regions facing to each other across the channel region become the source and drain regions.

By using the producing method, the floating gate electrode can be made at the center of the neighboring trench isolations.

Also, by using the producing method, a memory cell having a LDD structure can be formed and, thereby, the memory cell of high stability can be obtained.

Preferably, the thickness of the oxide film is about ¼ of the minimum resolution (F) of photolithography method for producing the non-volatile semiconductor memory device.

Thereby, a small-sized memory cell can be obtained.

Preferably, the thickness of the oxide film is about ¼ of the gate length of the floating gate electrode.

Thereby, a small-sized memory cell can be obtained.

Also, the prevent invention provides a method, wherein the step of forming source and drain regions comprising the step of forming self-aligned side spacers on the side walls of the trench isolations, so that regions of the semiconductor substrate below the side spacers become the source and drain regions, and the step of forming the gate electrode comprising the step of forming the tunnel film and a polycrystalline silicon layer on the substrate across which the source and drain regions are facing to each other.

By using the method, the floating gate electrode can be formed at the center of the neighboring trench isolations.

The tunnel film may be a nitrided oxide film.

The polycrystalline silicon layer may be further formed on the side spacers.

By using such a structure, an area of a unit memory cell can be reduce without decreasing an area of the floating gate electrode which is facing to the control gate electrode.

Also, the prevent invention provides a method, wherein the step of forming the trench isolations comprises the steps of forming a multi-layer film comprising a lower oxide film and a silicon nitride film, the multi-layer film being thicker than the minimum resolution (F) of photolithography method for producing the non-volatile semiconductor memory device, forming a recess in the multi-layer film to expose the surface of the semiconductor substrate, embedding the recess by buried oxide film, and removing the multi-layer to project the buried oxide film above the surface of the semiconductor substrate, the buried oxide film becoming the trench isolation.

By using the method, the height of the trench isolation becomes more than the minimum resolution (F). Therefore, when the floating gate electrode is also formed on the side spacers, an area of a memory cell can be reduced, with maintaining an area 3 $F^2$ or more of the floating gate electrode which is facing to the control gate electrode.

Also, the present invention provides a method, wherein the step of forming the trench isolations comprises the steps of forming a multi-layer film comprising a lower oxide film and silicon nitride film, the multi-layer film is thicker than gate length of the floating gate electrode, forming a recess in the multi-layer film to expose a surface of the semiconductor substrate, embedding the recess by buried oxide film, and removing the multi-layer to project the buried oxide film above the surface of the semiconductor substrate, the buried oxide film becoming the trench isolation.

By using the method, the height of the trench isolation becomes more than the gate length of the floating gate electrode. Therefore, when the floating gate electrode is also formed on the side spacers, an area 3 $F^2$ or more of a memory cell can be reduced, with maintaining an area of the floating gate electrode which is facing to the control gate electrode.

The distance between the neighboring trench isolations may be about twice of the minimum resolution (F) of photolithography method for producing the non-volatile semiconductor memory device.

By using the method, the self-aligned floating gate electrode can be formed at the center of the neighboring trench isolations and, therefore, the distance between the neighboring trench isolations can be reduced. This results in that an area of a unit memory cell can be 6 $F^2$.

The distance between the neighboring trench isolations may be about twice of the gate length of the floating gate electrode.

By using the method, the self-aligned floating gate electrode can be formed at the center of the neighboring trench isolations and, therefore, distance between the neighboring trench isolations can be reduced.

Also, the present invention provides a non-volatile semiconductor memory device. The memory device includes a semiconductor substrate having a surface, trench isolations formed substantially parallel to each other and projected from the surface, self-aligned side spacers formed on the side walls of the trench isolations, source and drain regions formed in the semiconductor substrate below the side spacers, a channel region formed in the semiconductor substrate between the source and drain regions, and a floating gate electrode formed on the channel region through a tunnel film.

According to the non-volatile semiconductor memory device, the floating gate electrode can be formed at the center of the neighboring trench isolations, so that the resistance of the source line is substantially equal to that of the drain line. This prevents the erroneously detection of the information of a memory cell.

Also, the self-aligned floating gate electrode can be formed at the center of the neighboring trench isolations and, thereby, the distance between the neighboring trench isolations can be reduced and an area of a unit memory cell can be also reduced.

Preferably, the source and drain regions are formed by diffusing impurities from the side spacers into the semiconductor substrate under the side spacers.

In this structure, the width of the source region is substantially equal to that of the drain region, and the floating gate electrode is formed at the center of the neighboring trench isolations.

Preferably, the source and drain regions are formed from the regions of the semiconductor substrate which are covered with the side spacers during the ion implantation process using the side spacers for masks.

In this structure, the width of the source region becomes substantially equal to that of the drain region, and the floating gate electrode is formed at the center of the neighboring trench isolations.

Each of the source and drain regions may comprise a first region adjacent to the trench isolation and a second region, the concentration of the impurities in the second region being lower than that of the first region.

In this structure, a memory cell has a LDD structure and, thereby a memory cell of high stability can be obtained.

Thickness of the tunnel film may be substantially constant.

This prevents the thinning of the tunnel film, so that the thickness of the tunnel film is substantially constant. Also, this prevents the concentration of the electric field at the thinned portion of the tunnel film.

The width of the side spacers are substantially equal to each other.

In this structure, the self-aligned spacers can be formed and, therefore, the width of the spacer is substantially equal to each other.

The width of the source region is substantially equal to that of the drain region.

In this structure, the self-aligned source and drain regions can be obtained and, thereby, the width of source and drain regions are substantially equal to each other.

Preferably, the distance between the neighboring trench isolations is about twice of the minimum resolution (F) of photolithography method for producing the non-volatile semiconductor memory device.

In this structure, the self-aligned source region or the like can be obtained and, a margin for the producing process can be reduced. Therefore, distance between the neighboring trench isolations can be reduced to about twice of the minimum resolution (F).

Preferably, the distance between the neighboring trench isolations is about twice of the gate length of the floating gate electrode.

In this structure, the self-aligned source region or the like can be obtained and, a margin for the producing process can be reduced. Therefore, the distance between the neighboring trench isolations can be reduced to about twice of the gate length of the floating gate electrode.

Preferably, the distance between the surface of the semiconductor substrate and a top of the trench isolation is substantially equal to the minimum resolution (F) of photolithography method for producing the non-volatile semiconductor memory device.

In this structure, an area of a unit memory cell can be reduced with maintaining an area of the floating gate electrode which is facing to the control gate electrode 3 $F^2$ or more.

Preferably, the distance between the surface of the semiconductor substrate and a top of the trench isolation is substantially equal to the gate length of the floating gate electrode.

In this structure, an area of a unit memory cell can be reduced with maintaining an area of the floating gate electrode which is facing to the control gate electrode 3 $F^2$ or more.

The floating gate is formed to cover a side wall of the trench isolation.

In this structure, an area of a unit memory cell can be reduced with maintaining an area of the floating gate electrode which is facing to the control gate electrode 3 $F^2$ or more.

As can be seen from above description, by using the method for producing a non-volatile semiconductor memory device according to the present invention, the floating gate electrode can be formed in the center of the neighboring trench isolations. Thereby, a non-volatile semiconductor memory device of which source and drain lines have a certain resistance can be obtained.

Also, by using the method according to the present invention, an area of a memory cell becomes 6 $F^2$, so that a highly integrated non-volatile semiconductor memory device can be obtained.

Also, by using the method according to the present invention, the short-circuit between neighboring memory cells caused by an etching residue can be prevented.

DETAILED DESCRIPTION OF THE PREFERRED EMBODIMENTS

I. Embodiment 1

Referring to FIGS. 1A to 5N, a method for producing a non-volatile semiconductor memory device of first embodiment according to the present invention will be described hereinafter.

Figure 1A:
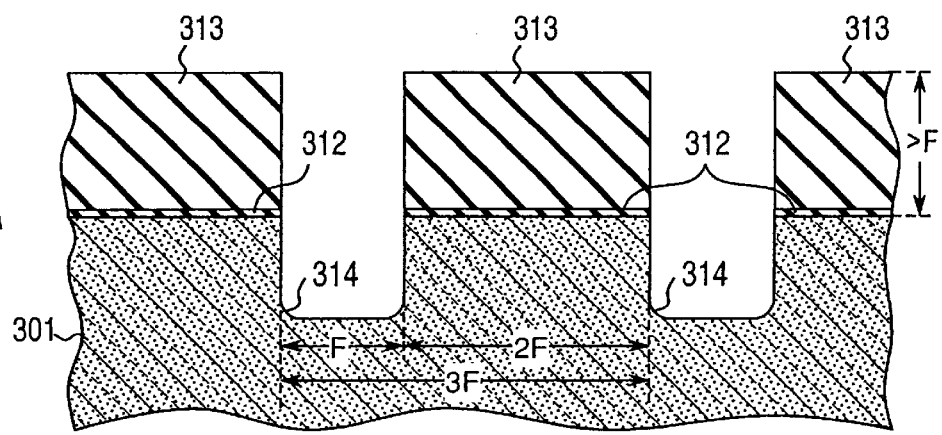
FIGS. 1A–5N are cross sectional views of a non-volatile semiconductor memory device according to the first embodiment of the present invention.

According to the method, as shown in FIG. 1A, a top surface of a silicon semiconductor substrate 3 is oxidized by thermal oxidation method and, thereby, a lower oxide film 312 having a thickness of about 250 Å. Also, a silicon nitride film 313 is deposited on the lower oxide film 312 by LPCVD method. The thickness of a multi-layer consisting of the lower oxide film 312 and the silicon nitride film 313 is greater than the minimum resolution (F) in photolithography which is used in a process for producing the non-volatile semiconductor memory device. Generally, the minimum resolution (F) is substantially equal to the gate length of a memory cell transistor of the semiconductor memory device.

It should be noted that the minimum resolution (F) is defined by the minimum line width which can be formed on the semiconductor substrate by using the producing method of the non-volatile semiconductor memory device of this embodiment.

Then, the silicon nitride film 313, the lower oxide film 312 and the semiconductor substrate 301 are etched by using lithography and etching technologies. This results in the grooves 314 for trench isolations each having a width of about F are formed about 2 F apart. Subsequently, a photoresist used for the etching mask is removed.

Alternatively, a polycrystalline silicon film may be deposited between the lower oxide film 312 and the silicon nitride film 313 by LPCVD method. The thickness of a multi-layer consisting of the lower oxide film 312, the polycrystalline silicon film and the silicon nitride film 313 is thicker than the minimum resolution (F). When the silicon nitride film 313 is formed directly on the lower oxide film 312, a stress is occurred between these films 312 and 313, thereby a damage is induced in the semiconductor substrate 301 under the lower oxide film 312 in which a channel region will be formed. The polycrystalline silicon film is formed between these films 312 and 313 as a buffer layer, so that the damage induced into the channel region is reduced. The trench isolation formed by the process using the polycrystalline silicon film is called a poly buffer trench isolation.

Figure 1B:
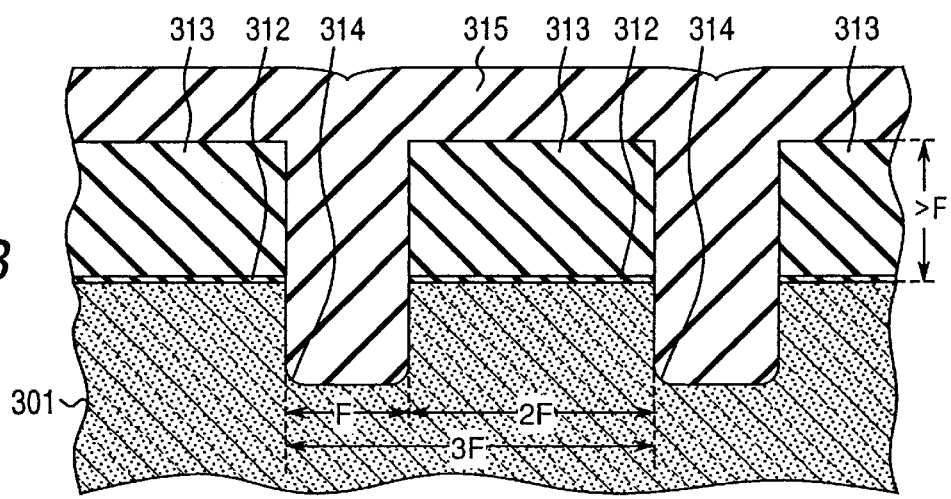

Then, as shown in FIG. 1B, a thick oxide film 315 is formed on the silicon nitride film 313 to embed the grooves 314. The thick oxide film 315 may be a high temperature oxide film formed by LPCVD method using silane gas, a TEOS oxide film formed by LPCVD method using TEOS gas or an HDP-SiO$_2$ film formed by high density plasma CVD method, for example.

In the case shown in FIG. 1B, a high temperature oxide film or a TEOS oxide film is used for the thick oxide film 315. When an HDP-SiO$_2$ film is used, a recess which is formed at the center of the trench isolation can be prevented. This results in that a floating gate electrode and a control gate electrode can be etched easily.

Figure 1C:
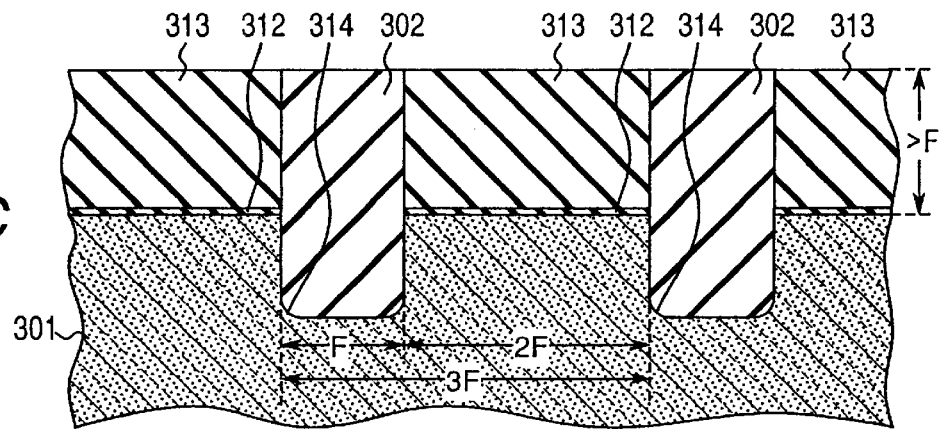

Then, as shown in FIG. 1C, the thick oxide film 315 is polished until a top of the silicon nitride film 313 is exposed by CMP method using the nitride film 313 as an etching stop, for example. This results in that the distance between the surface of the semiconductor substrate 301 and a top of the trench isolation 302 is formed larger than the minimum resolution (F).

Figure 2D:
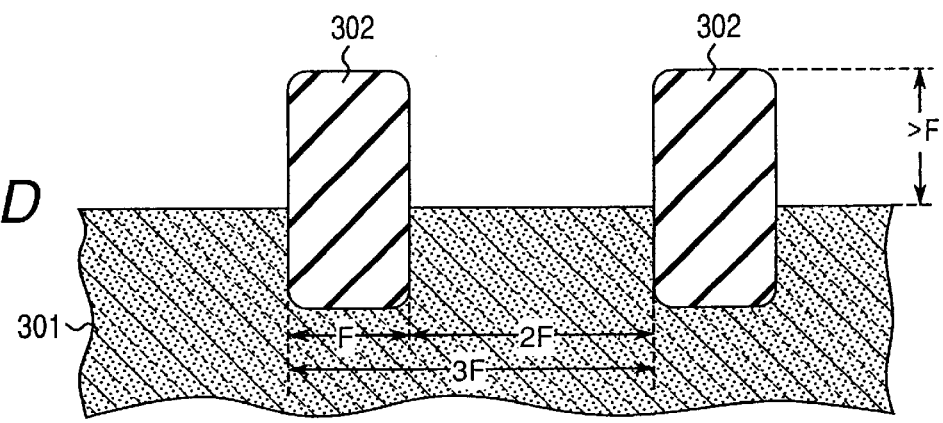

Then, as shown in FIG. 2D, the silicon nitride film 313 is removed by using hot phosphoric acid, and then the lower oxide film 312 is removed by using hydrofluoric acid.

When the high temperature oxide film or the TEOS oxide film is used for the thick oxide film 315, the thick oxide film 315 is also deposited on a bottom surface of the semiconductor substrate 1. In this case, after the top of the silicon nitride film 313 is exposed to light by CMP method, a photoresist is formed over the top surface of the semiconductor substrate 301. Then, the thick oxide film 315 deposited on the bottom surface of the semiconductor substrate 1 is removed by using hydrofluoric acid. Then, the photoresist is removed, and the silicon nitride film on both surfaces of the semiconductor substrate 301 is removed at the same time by using hot phosphoric acid. This is because, when the silicon nitride film is remained on the bottom surface of the semiconductor substrate 301, the semiconductor substrate 301 is bent by the stress between the silicon nitride film and the semiconductor substrate 301, so that the displacement at the periphery of the substrate becomes about 60–80 μm, for example. Thereby crystal defects, for example, are induced in the surface of the semiconductor substrate 301, which decreases the reliability of the non-volatile semiconductor memory device.

On the other hand, when the HDP-SiO$_2$ film is used as the thick oxide film 315, the oxide film 315 is formed only on the top surface of the semiconductor substrate 301. Therefore, the silicon nitride film 313 formed on the bottom surface of the semiconductor substrate 301 is also removed at the removal of the silicon nitride film 313 formed on the top surface.

When the polycrystalline silicon film is formed between the lower oxide film 312 and the silicon nitride film 313 both of which being formed on the top surface of the semiconductor substrate 301, the polycrystalline silicon is removed by a dry etching method. Preferably, Polycrystalline silicon dry etching method, which gives little physical or chemical damage, is used for the dry etching. This is because that the semiconductor substrate 301 in which a channel region will be formed suffers from a slight damage.

It is noted that the polycrystalline silicon film may be removed by dipping it into a NH$_4$OH/H$_2$O$_2$ solution. When the solution is used, substantially no physical or chemical damage is provided to the semiconductor substrate 301. Also, the chemical damage to the semiconductor substrate 301 caused by the NH$_4$OH/H$_2$O$_2$ solution is prevented by the lower oxide film 312.

Figure 2E:
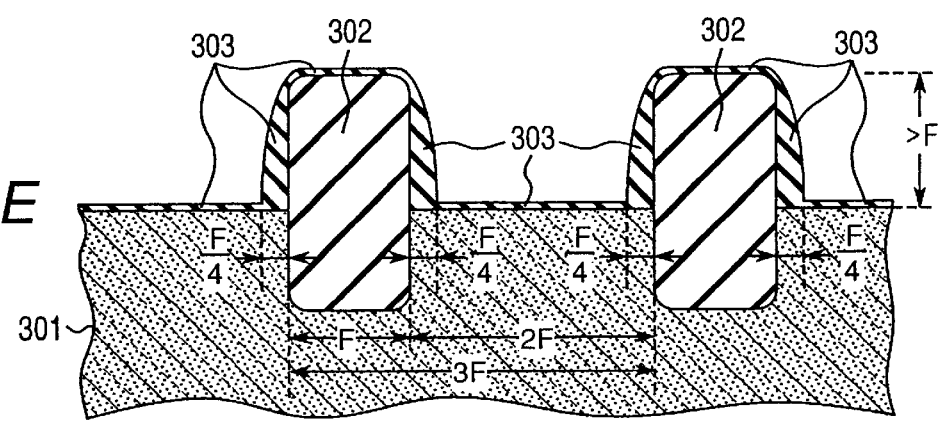

Then, as shown in FIG. 2E, a high concentration oxide film 303 comprising n type impurities of about $1\times10^{21}$/cm$^3$ and having a thickness of about F/4 is deposited on the substrate 301 and the trench isolation 302 by LPCVD method. Also, the high concentration oxide film 303 on the semiconductor substrate 301 is etched back to a thickness of about 100 Å by dry etch back technology to form side spacers 303 on the each side wall of the trench isolation 302.

Figure 2F:
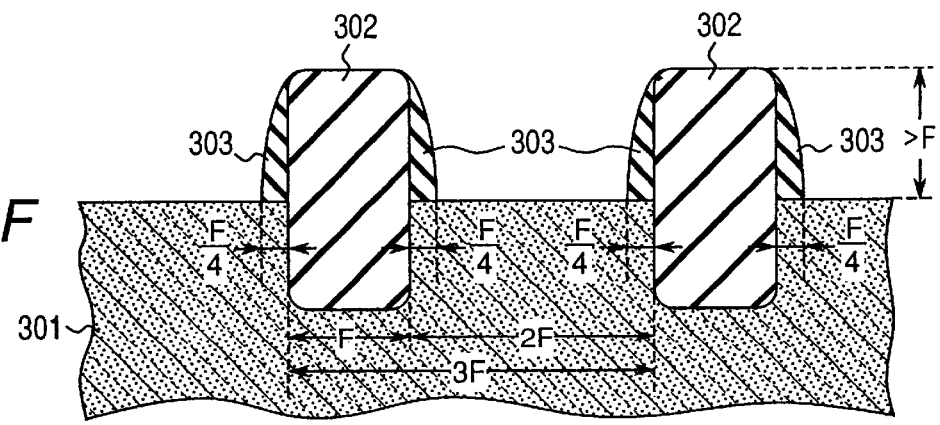

Then, as shown in FIG. 2F, the high concentration oxide film 303 remained on the surface of the semiconductor substrate 301 of about 100 Å in thickness is removed by hydrofluoric acid. In this case, the 100-Å-thickness film 303 to be etched is thinner than the side spacers, therefore the side spacers are scarcely etched.

As mentioned above, the high concentration oxide film 303 of about 100 Å in thickness is remained on the semiconductor substrate 301 after the dry etch back process, and then removed by hydrofluoric acid. This is because that an etching damage is induced to the surface of the semiconductor substrate 301 in which the channel region will be made, so that a crystalline defect and/or an interface state is occurred in the region, when all the high concentration oxide film 301 is etched back and then removed by the dry etch back method.

Figure 3G:
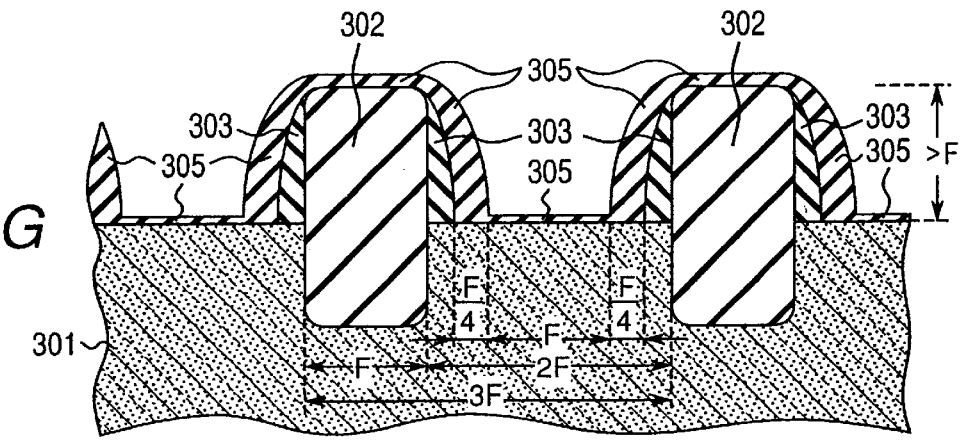

Then, as shown in FIG. 3G, a low concentration oxide film 305 comprising n type impurities, for example phosphorus or arsenic, of about $1\times10^{19}$/cm$^3$ and having a thickness of about F/4 is deposited by LPCVD method.

Figure 3H:
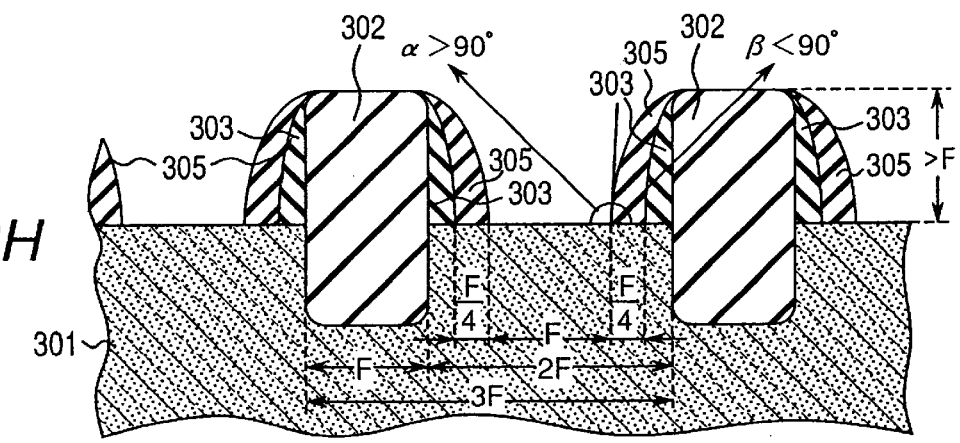

Then, as shown in FIG. 3H, the low concentration oxide film 305 is removed by the same process as shown in FIG. 2F, so that side spacers of the low concentration oxide film 305 are formed.

Figure 3I:
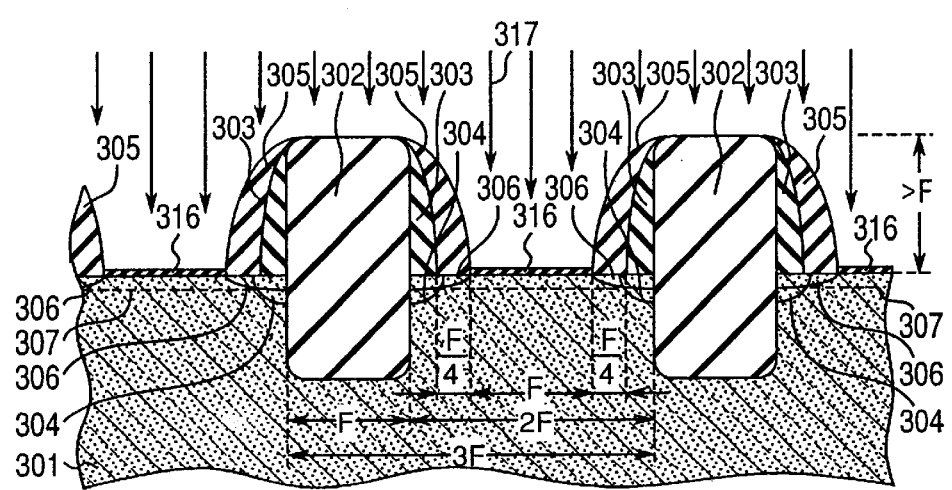

Then, as shown in FIG. 3I, the surface of the semiconductor substrate 301, in which a channel region will be made, is oxidized by thermal oxidation method, so that a sacrificed oxide film 316 of about 200 Å in thickness is formed. Also, the semiconductor substrate 301 is annealed in a nitrogen gas, at about 900–1000° C. and for about 30–60 minutes. This results in that n type impurities of high concentration are diffused from the high concentration side spacers into the semiconductor substrate 301, thereby n$^+$ diffused layers 304 are formed in the semiconductor substrate 301 under the high concentration side spacers. On the other hand, n type impurities of low concentration are diffused from the low concentration side spacers into the semiconductor substrate 301, thereby n$^-$ diffused layers 306 are formed in the semiconductor substrate 301 under the low concentration side spacers.

Referring to FIG. 3I, the n$^+$ diffusion layer 304 and n$^-$ diffusion layer 306 at the left side of the trench isolation 302 form a drain line (a drain region), and the n$^+$ diffusion layer 304 and n$^-$ diffusion layer 306 at the right side of the trench isolation 302 form a source line (a source region).

It should be noted that, the diffusion layers 304 and 306 at the left side of the trench isolation 302 may form a source line (a source region), and the diffusion layers 304 and 306 at the right side of the trench isolation 302 may form a drain line (a drain region).

It is important that the side spacers on the side walls of the trench isolation 302 are formed by self-aligned technology, so that the side spacers formed on the side walls of the trench isolation 302 have a certain width. Further, the diffusion films 303 have a certain width, and the diffusion film 305 have also a certain width. This results in that the width of the drain line is almost the same as that of the source line, so that resistance of the source and drain lines are also almost the same.

It should be noted that the width of the side spacer is defined by the region of the side spacer adjacent to the semiconductor substrate 301 in the direction of a gate length.

Also, the side spacers are formed by self-alignment technology, so that the side spacers formed at both sides of the trench isolation 302 are symmetric to each other.

Figure 20:
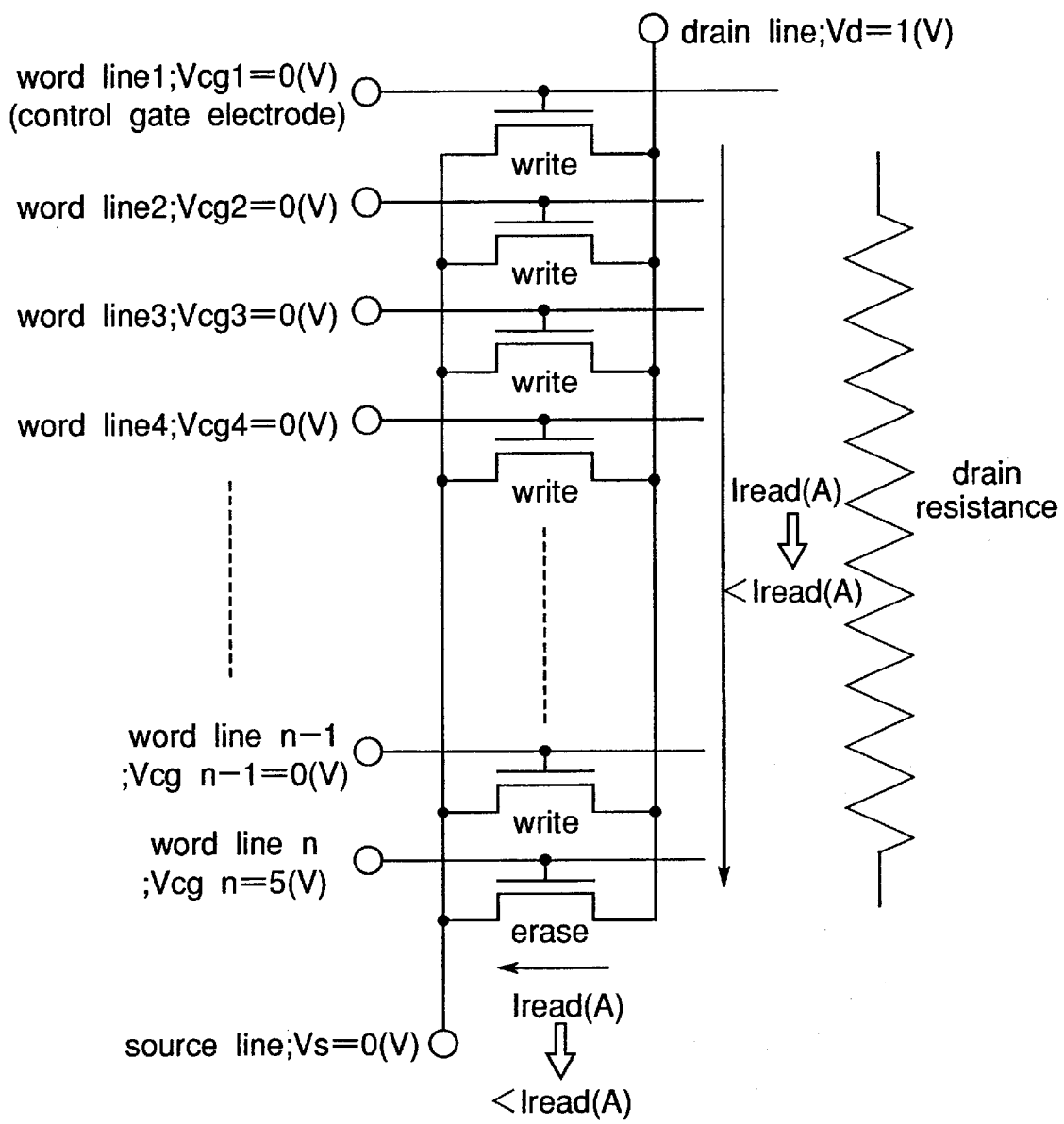
FIG. 20 is an equivalent circuit diagram of a conventional non-volatile semiconductor memory device.

As mentioned above, the resistance of the drain and source lines are almost the same in the structure of this embodiment. Therefore, when n pieces of memory cell are connected in parallel between a couple of drain and source lines as shown in FIG. 20 and a memory cell m in erase mode is accessed, read error often occurred in the conventional memory device structure due to that the resistance of the drain line is higher than that of the source line is prevented.

Then, a channel dose implantation to the semiconductor substrate 301, which determines threshold voltage (UV-Vth) of the memory cell, is performed by an ion implantation method. Particularly, ions 317 are implanted into the semiconductor substrate 301 through the sacrificed oxidation layer 316 using the side spacers made of the high concentration oxide film 303 and low concentration oxide film 305 and trench isolations 302 as a mask, thereby a channel dose implanted region 307 is formed.

The implantation of the ions 317 is performed under the following conditions, for example. P type impurities of boron are implanted at implantation energy of about 30 KeV and implanted concentration of about $1 \times 10^{13}/cm^3$.

As mentioned above, the channel dose implantation is performed through the sacrificed oxide film 316. This is because that, when the ions 317 are implanted into the semiconductor substrate 301 without the sacrificed oxide film 316 and having an exposed surface, damages are induced into the surface of the semiconductor substrate 301. Crystal defects and/or interface states are formed in the semiconductor substrate 301 by the damages.

Figure 4J:
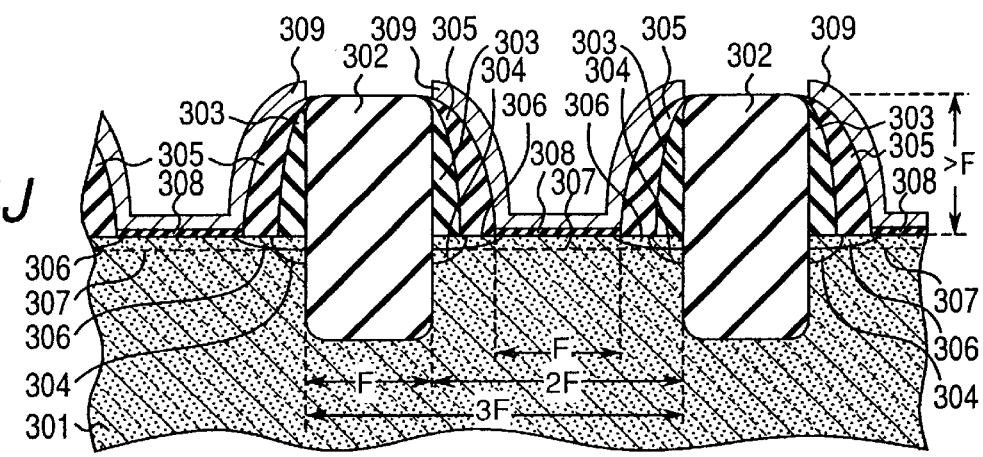

Then, as shown in FIG. 4J, the sacrificed oxide film 316 is removed using hydrofluoric acid, so that a tunnel oxide film below 100 Å in thickness is formed on a channel region of the semiconductor substrate 301. The tunnel film 308 is formed by oxidizing the surface of the semiconductor substrate 301 in an oxidative gas. The tunnel film 308 may be a nitride oxide film formed in the oxidative gas including ammonium gas ($NH_3$), NO gas or $N_2O$ gas.

It is important that thinning of the tunnel film 308 at the region adjacent to the side spacer can be prevented. The thinning means that the thickness of the tunnel oxide film 316 becomes thinner at the region adjacent to the side wall. This phenomenon is occurred by the reason that an angle between the semiconductor substrate 301 and the side wall is small, so that oxidation species are difficult to reach the semiconductor substrate 301 at the region adjacent to the side spacer in the oxidation process shown in FIG. 4J. The thinning of the tunnel oxide film 308 becomes a cause of the concentration of electric field. This results in that a quality of the tunnel film 308 is decreased, that a breakdown through the tunnel oxide film 308 is occurred, and that electrons can not be stored in a floating gate.

On the other hand, the side spacer of this embodiment is formed of an oxide film having n type impurities. Such an n type impurities increase oxidation rate, therefore the thinning of the tunnel oxide film 308 at the region adjacent to the side space can be prevented. Also, the tunnel oxide film 308 at the region can be thicker than that of other regions. Therefore, a concentration of electric field is not occurred in the tunnel oxide film 308, so that a memory cell of high reliability can be obtained.

Then, a polycrystalline silicon layer having n type impurities such as phosphorus of $2-5 \times 10^{20}/cm^3$ is deposited over the semiconductor substrate 301 by LPCVD method, for example.

Then, The polycrystalline silicon layer above the top of the trench isolation 302 is removed by photolithography technology and unisotropic polycrystalline etching technology, thereby a floating gate electrode 309 is formed.

In this floating gate electrode 309, the length of a region of the floating gate electrode 309 which meets the tunnel oxide film 308 between the side spacers is defined as gate length Lg. Generally, the gate length Lg is similar to the minimum resolution (F) used in photolithography process.

In order to increase an access rate of a memory cell, capacitance Ccg–fg between a control gate electrode and a floating gate electrode must be increased.

Figure 19A:
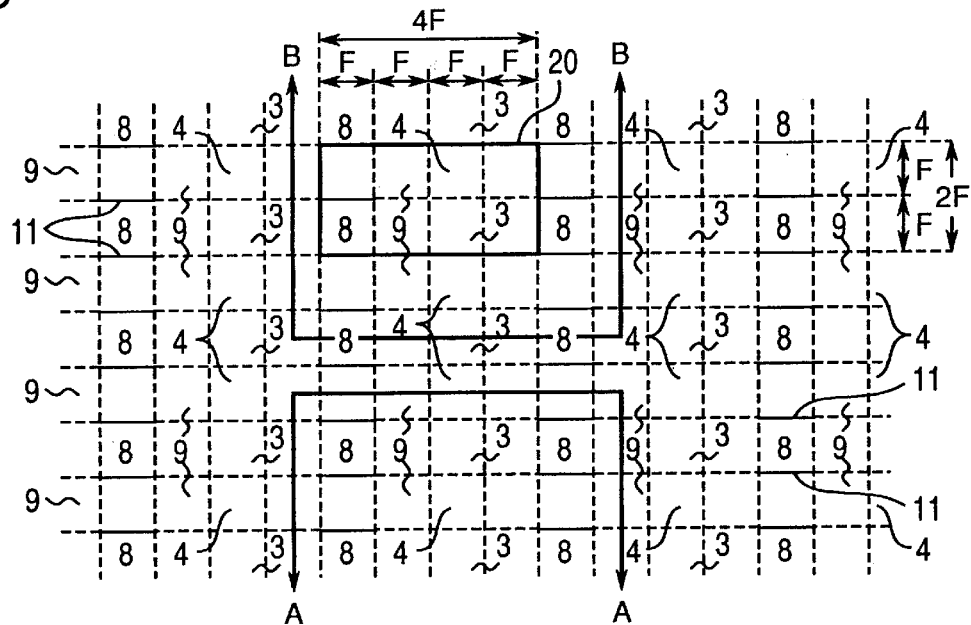
FIG. 19A is a plan view of a conventional non-volatile semiconductor memory device.
Figure 19B:
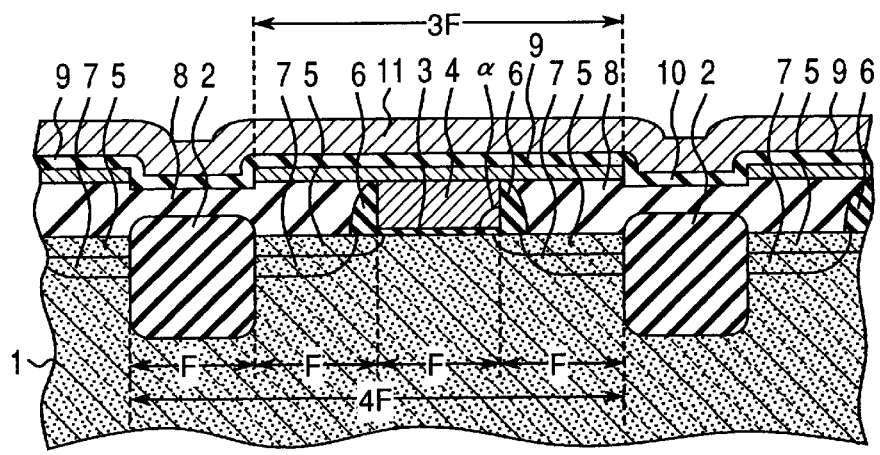
FIG. 19B is a cross sectional view along lines A—A of FIG. 19A.
Figure 19C:
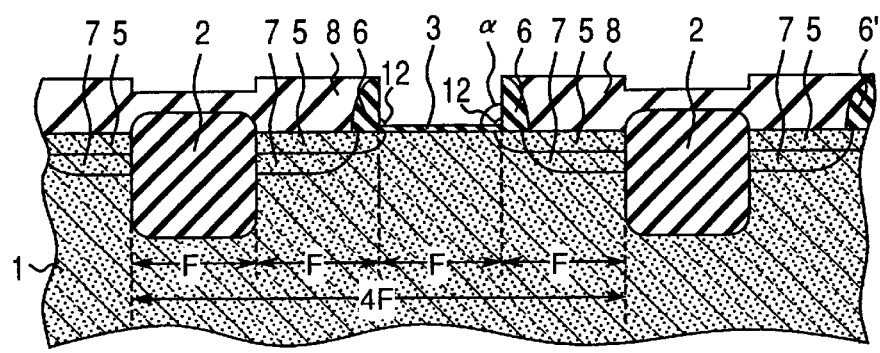
FIG. 19C is a cross sectional view along lines B—B of FIG. 19A.

In the conventional structure as shown in FIGS. 19A–19C, a fin-type floating gate electrode 9 electrically connected to a floating gate 4 is formed, thereby the area of the region of the floating gate electrodes 4 and 9 facing to the control electrode is increased to $3\ F^2$. That is, in the case that only the floating gate electrode 4 is used, the area of the region of the floating gate electrode 4 facing to the control electrode is $1\ F^2$ ($1\ F \times 1\ F$) which is about ⅓ of the conventional structure. Therefore, in the conventional structure, the fin-type floating gate electrode 9 is formed on the floating gate electrode 4, so that capacitance between the opposite electrodes is increased.

On the other hand, in the structure of this embodiment as shown in FIG. 4J, the floating gate electrode 309 is formed on the tunnel film 308 and the side spacers. Also, the distance between the surface of the semiconductor substrate 301 and the top of the trench isolation 302 is larger than F. Therefore, the area of the region of the floating gate electrode 309 facing to the control electrode 310 becomes $3\ F^2$ or more. That is, in the structure of this embodiment, capacitance of a memory cell without the fin-type floating gate electrode can be equal to or more than that of conventional structure.

It should be noted that, the gate width of the floating gate electrode 309 is substantially equal to the minimum resolution (F).

Figure 4K:
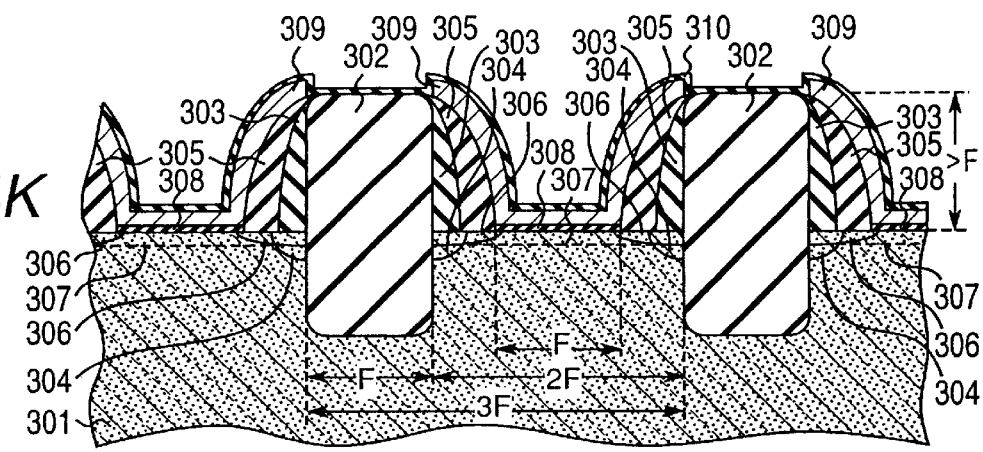
Figure 4L:
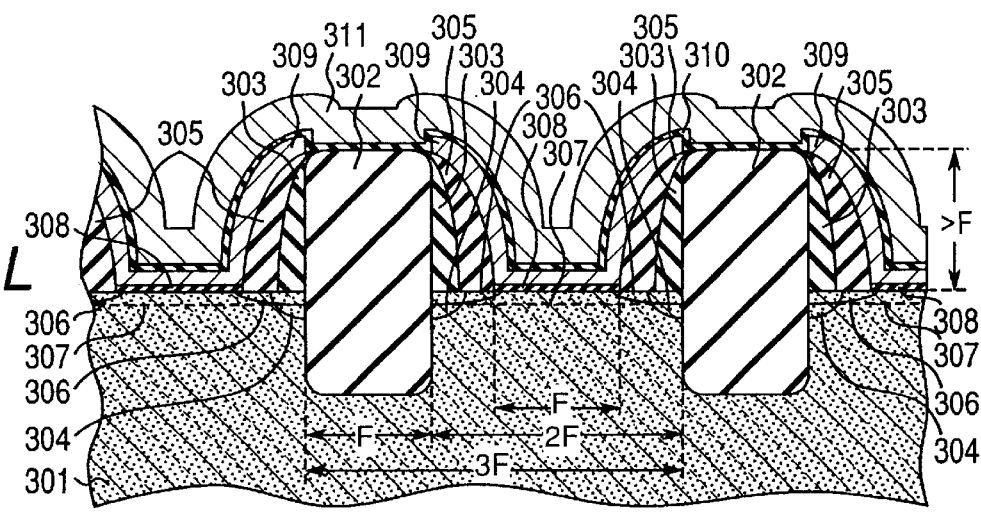

Then, as shown in FIG. 4K, an inter poly insulating film 310 is formed over the semiconductor substrate 301. Generally, the inter poly insulating film 310 is a multi-layer structure. For example, the inter poly insulating film 310 is made from a multi-layer film (an ONO film) of silicon oxide, silicon nitride and silicon oxide or a multi-layer film (an ONON film) of silicon oxide, silicon nitride, silicon oxide and silicon nitride. The silicon oxide film and the silicon nitride film are formed by LPCVD method or thermal oxidation method. The inter poly insulating film 310 is about 150–200 Å in thickness Then, as shown in FIG. 4L, a conducting film and an insulating film are successively deposited on the inter poly insulating film 310. Each of the conducting film and insulating film is about 2000 Å in thickness.

The conduction film is made from a polycrystalline silicon single-layer in which an n type impurities such as phosphorus of $6-8 \times 10^{20}/cm^3$ are doped. Also, the conduction film may be made from a multi layer film (polycide film) consisting of the polycrystalline silicon film and a silicide film of refractory metal such as $WSi_2$ and $MoSi_2$.

Figure 6A:
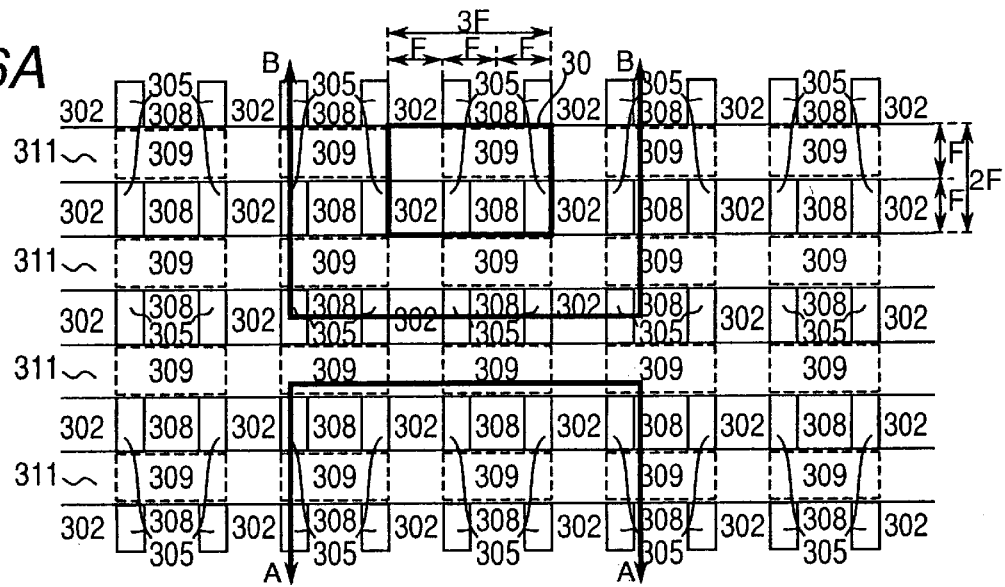
FIG. 6A is a plan view of a non-volatile semiconductor memory device according to the first embodiment of the present invention.

According to above steps, as shown in FIG. 6A, a word line portion of the non-volatile semiconductor memory device is completed. FIG. 4L corresponds to the cross sectional view along lines A—A in FIG. 6A.

Figure 5M:
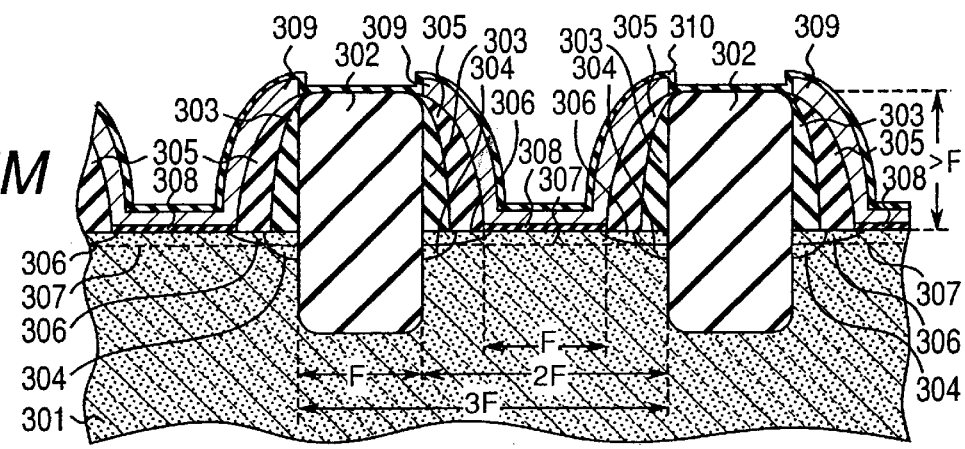

Then, as shown in FIG. 5M, the major part of the control gate 311 is removed so that it remains in part to form the word line portion by photolithography method and dry etching technology, so that the control gate is remained at the word line portion. FIG. 5M corresponds to the cross sectional view along lines B—B in FIG. 6A.

Figure 5N:
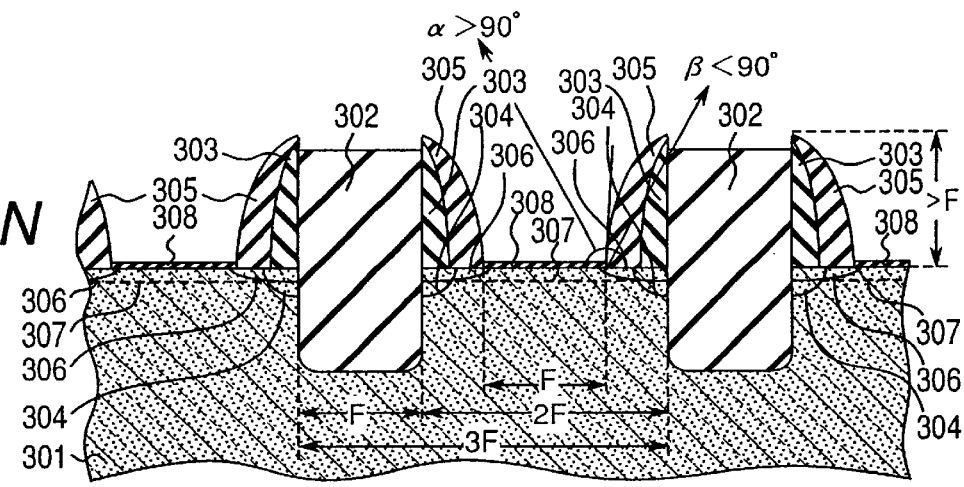

Finally, as shown in FIG. 5N, the inter poly insulating film 310 and the floating gate electrode 309 are removed except for the word line portion. Specifically, the inter poly insulating film 310 is etched by the etching technology. Also, the floating gate electrode 309 is etched by unisotropic etching technology.

In the etching step of the inter poly insulating film, the insulating film of the control gate electrode 311 at the word line portion is also etched. However, the thickness of the insulating film of the control gate electrode 311 (about 2000 Å) is ten times as thick as the that of the inter poly insulating film 310 (150–200 Å) or more, therefore the insulating film of the control gate electrode 311 is never entirely removed.

Also, in the following step of etching for the floating gate electrode 309, the insulating film of the control gate electrode 311 still remains at the word line portion and, therefore, the conducting film under the insulating film of the control gate electrode 311 is never etched.

Figure 18G:
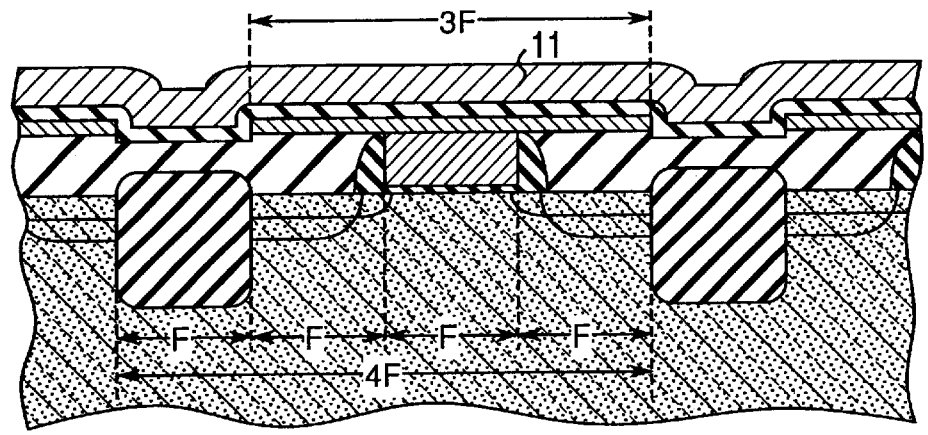
Figure 18H:
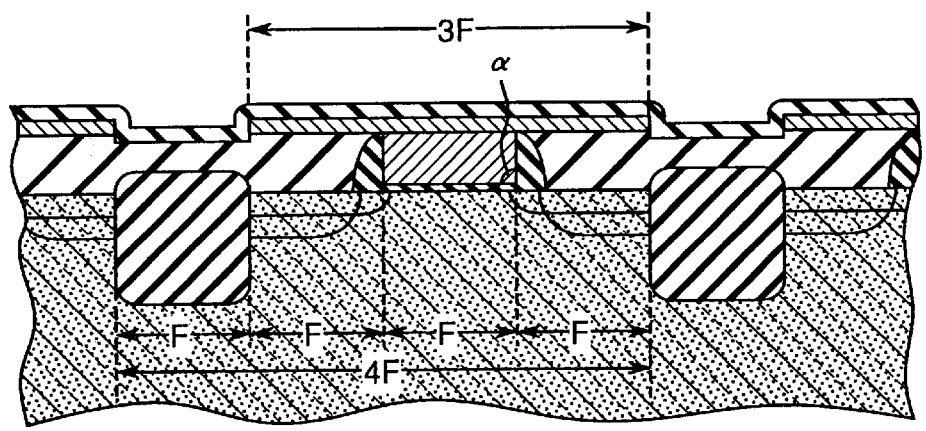
Figure 18I:
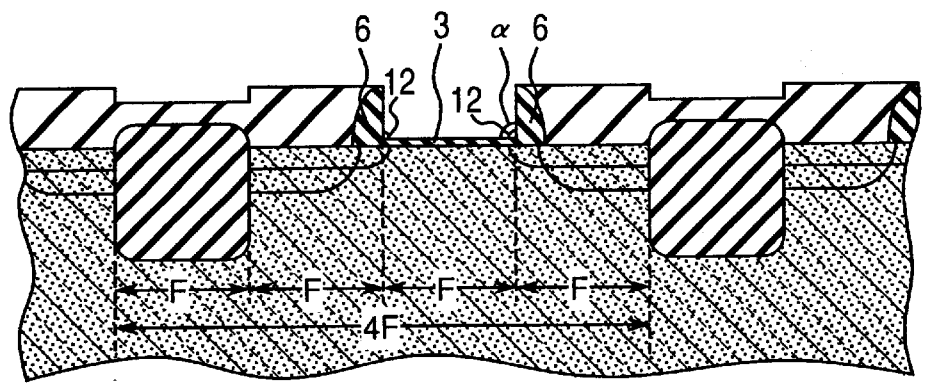

It is important that, as shown in FIG. 5N, in the unisotropic dry etching step of the floating gate electrode 309, an angle a between the floating gate electrode 309 and the semiconductor substrate 301 is more than 90°. Therefore, the residue 12 of floating gate electrode shown in FIG. 18I for conventional method is not formed. This prevents the formation of a residue 12 which would otherwise cause malfunction of the memory cells and the reliability of several hundred millions of memory cells can be increased, so that a non-volatile semiconductor memory device having high reliability can be obtained.

Figure 6B:
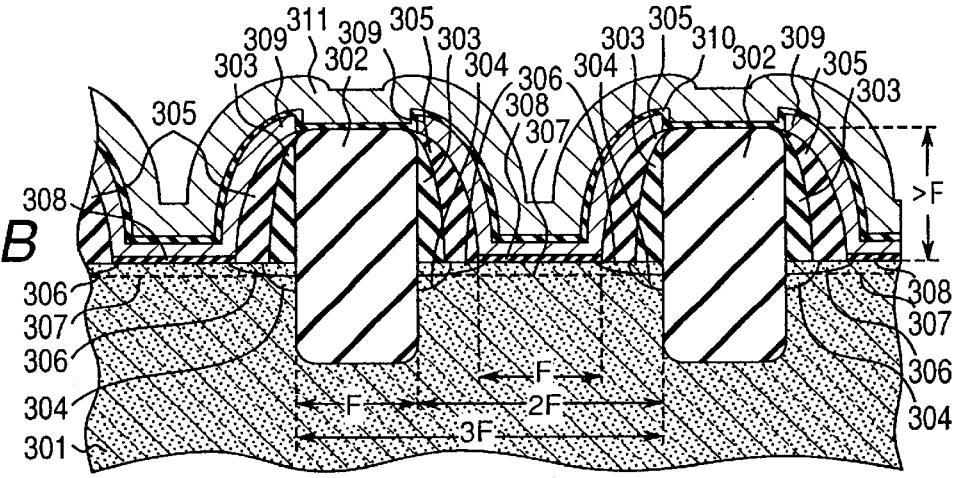
FIG. 6B is a cross sectional view along lines A—A of FIG. 6A.
Figure 6C:
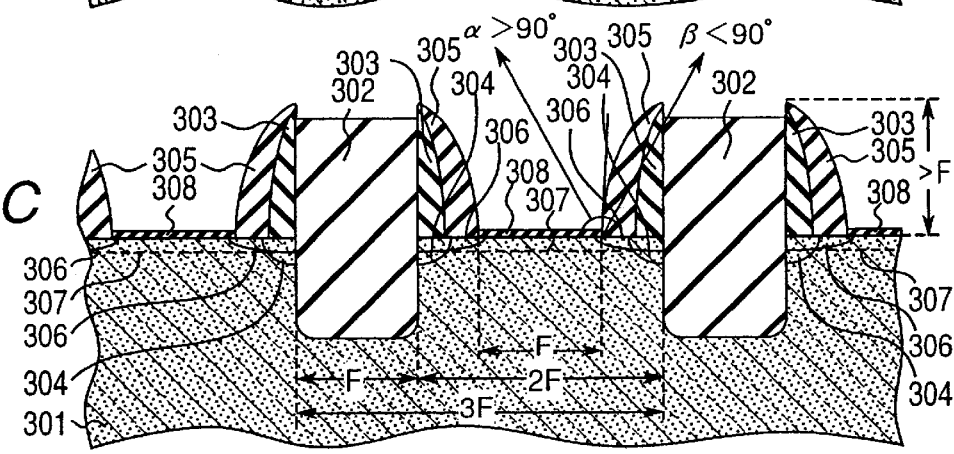
FIG. 6C is a cross sectional view along lines B—B of FIG. 6A.

FIG. 6A is a plan view of the non-volatile semiconductor memory device of this embodiment. FIG. 6B is a cross sectional view along lines A—A of FIG. 6A, that is a cross sectional view of the word line region. While, FIG. 6C is a cross sectional view along lines B—B of FIG. 6A, that is a cross sectional view of the no word line region.

As shown in FIG. 6A, the width of the control gate 311 (width of the word line) is substantially equal to the minimum resolution (F) which is used in the lithography method for producing the semiconductor memory device, or is substantially equal to the gate length of the semiconductor memory device.

Also, the distance between the neighboring control gate electrodes 311 is substantially equal to the minimum resolution (F), or is substantially equal to the gate length.

Therefore, the area of a memory cell 30 of the non-volatile semiconductor memory device is 6 $F^2$ [=(F+F)×(F+2F)], which is smaller than that of the conventional memory cell 8 $F^2$. This results in that the non-volatile semiconductor memory device which is highly integrated than the conventional memory device can be obtained.

It should be noted that a non-volatile semiconductor memory device having side spacers which are formed by self-aligned technology is disclosed in JP 2-151074 (A), however, the memory structure which comprises source and drain lines having the same resistance is not disclosed in it.

Subsequently, referring to FIGS. 7A–9, principle of operation of the non-volatile semiconductor memory device will be disclosed hereinafter.

Figure 7A:
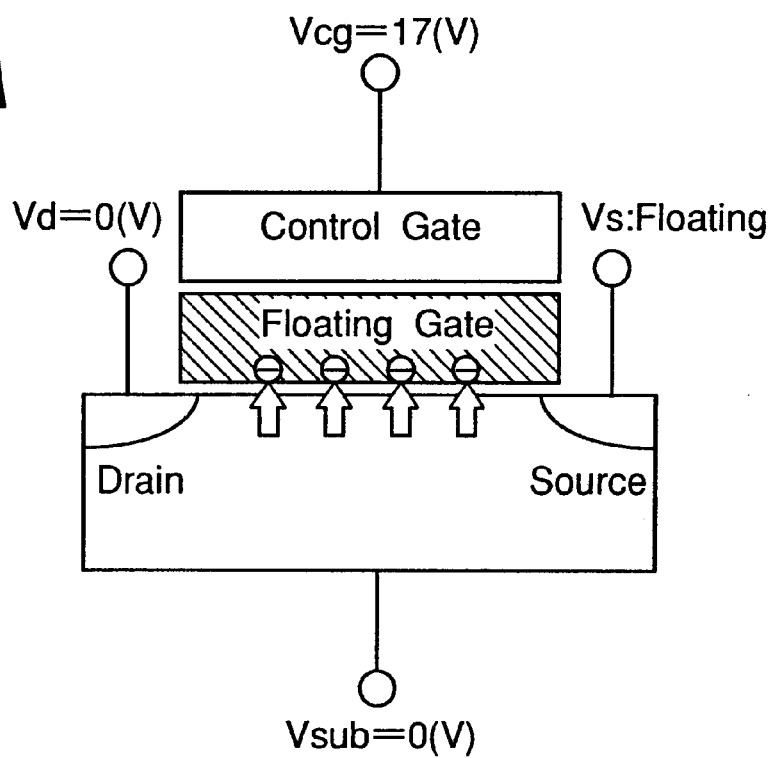
FIGS. 7A and 7B are cross sectional views of a memory cell according to the first embodiment of the present invention.
Figure 7B:
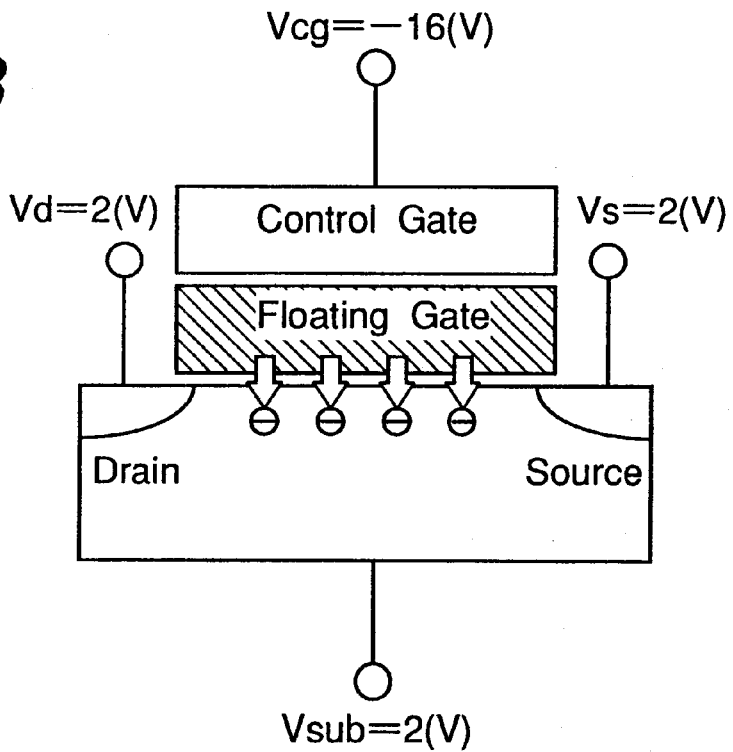

FIGS. 7A and 7B are cross sectional views of the memory cell of the non-volatile semiconductor memory device of this embodiment. The write/erase of the memory cell is performed by using Fowler-Nordheim tunneling.

In the memory cell shown in FIGS. 7A and 7B, information is stored by the floating gate electrode which can be charged. When electrons are implanted into the floating gate electrode so that the electrode is negatively charged, the threshold voltage Vth of the control gate electrode formed over the floating gate electrode is increased. This condition is the write mode. On the other hand, the floating gate electrode is not negatively charged, the threshold voltage Vth is decreased. This condition is erase mode.

The mode of the floating gate electrode is detected by biasing a voltage between these two threshold voltages and then knowing whether a memory cell comprising the floating gate electrode turns on.

Figure 8:
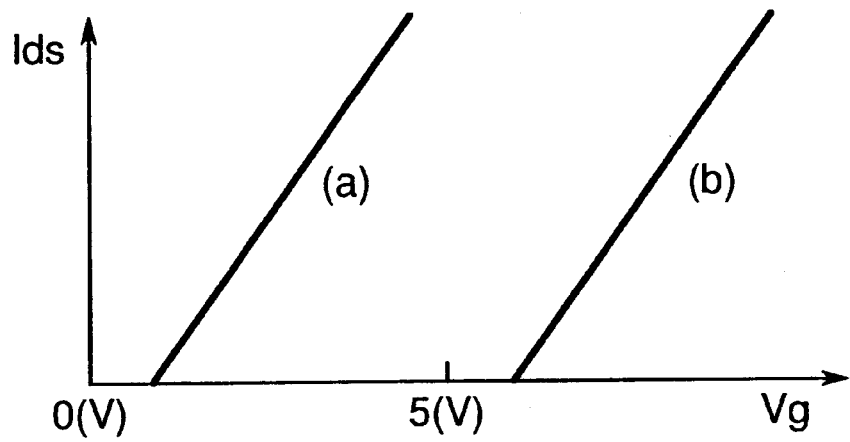
FIG. 8 is a graph showing gate voltage Vg versus source/drain current Ids characteristic of a memory cell according to the first embodiment of the present invention.

FIG. 8 is a graph showing a gate voltage Vg versus source/drain current Ids characteristic of a memory cell, in which lines (a) and (b) show the characteristic of memory cells in erase mode and in write mode, respectively. As can be seen from FIG. 8, voltage of about 5V is biased to the control gate electrode and then the current between source and drain (source/drain current Ids) is indicated, so that the information of the memory cell is detected.

An information is written into the memory cell by biasing the control gate electrode with a high voltage of about 17V as shown in FIG. 7A. When such voltage is biased to the control gate electrode, electrons are implanted from the semiconductor substrate into the floating gate electrode through the tunnel oxide film by Fowler-Nordheim tunneling, so that the floating gate electrode is negatively charged. Thereby, the memory cell changes to the write mode.

Figure 9:
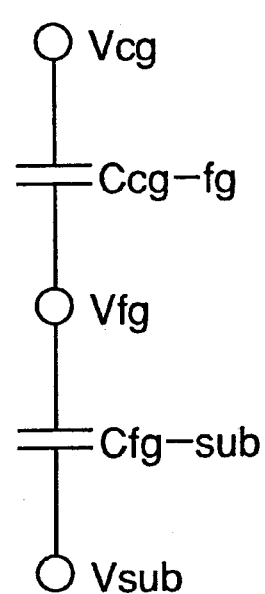
FIG. 9 is an equivalent circuit diagram of a memory cell according to the first embodiment of the present invention.

Referring to FIG. 9, an operation of a memory cell which turns from the erase mode into the write mode will be described. The potential of the control gate electrode, of the floating gate electrode and of the substrate are referred as Vcg, Vfg and Vsub, respectively. Also, the capacitance between the control gate electrode and the floating gate electrode, and between the floating gate electrode and the semiconductor substrate are referred as Ccg–fg and Cfg–sub.

In erase mode, the potential of the floating gate electrode is indicated by the following equation.

$$Vfg=Vcg \times Ccg\text{-}fg/(Ccg\text{-}fg+Cfg\text{-}sub)$$

It should be noted that the ratio of Ccg–fg/(Ccg–fg+Cfg–sub) is referred to as a coupling ratio.

The electrons are implanted into the floating gate electrode by the tunneling effect, therefore, the voltage between the floating gate electrode and the semiconductor substrate is increased. This also increases the writing rate.

When an information is written into the memory cell, the potential of the semiconductor substrate Vsub is 0V, then the voltage between the floating gate electrode and the semiconductor substrate is indicated by the following equation.

$$Vfg-Vsub-Vfg-0=Vcg \times Ccg\text{-}fg/(Ccg\text{-}fg+Cfg\text{-}sub)$$

This equation shows that the coupling ratio should be increased in order to increase the writing rate of the memory cell. That is, the capacitance Ccg–fg between the control gate electrode and floating gate electrode should be increased.

On the other hand, when the information is erased, negative voltage of about −16V is biased to the control gate electrode, and positive voltage of about 2V is biased to the source and drain electrodes and the semiconductor substrate, respectively. Thereby, electrons are emitted out of the floating gate electrode into the semiconductor substrate, so that the floating gate electrode is discharged, causing the information of the memory cell is erased.

It should be noted that the floating gate electrode is surrounded by a high quality insulating film, the electrons implanted into the electrode stay in the electrode unless the electrons have been emitted by above mentioned process. This results in that, the information of the memory cell is maintained when the power supply is disconnected from the non-volatile semiconductor memory device.

II. Embodiment 2

Referring to FIGS. 10A to 14O, a method for producing a non-volatile semiconductor memory device of second embodiment according to the present invention will be described hereinafter.

Figure 10A:
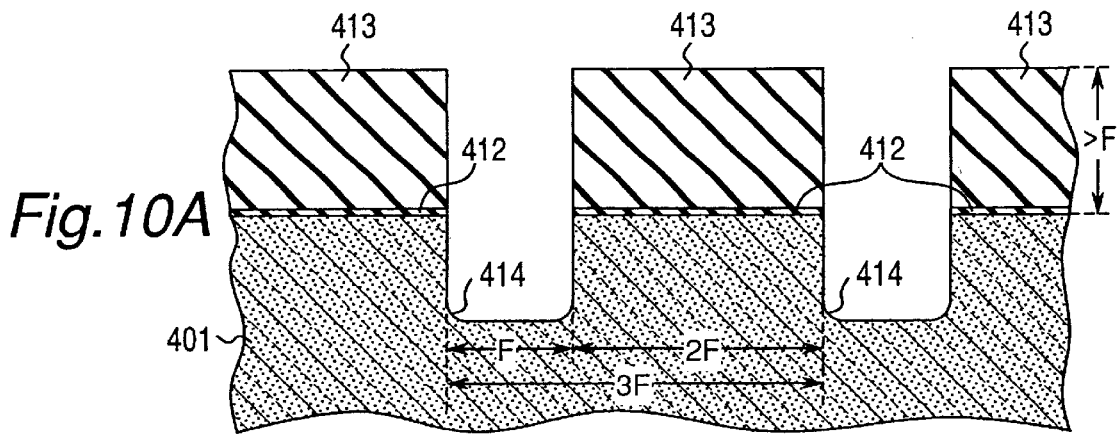
FIGS. 10A–14O are cross sectional views of a non-volatile semiconductor memory device according to the second embodiment of the present invention.
Figure 10B:
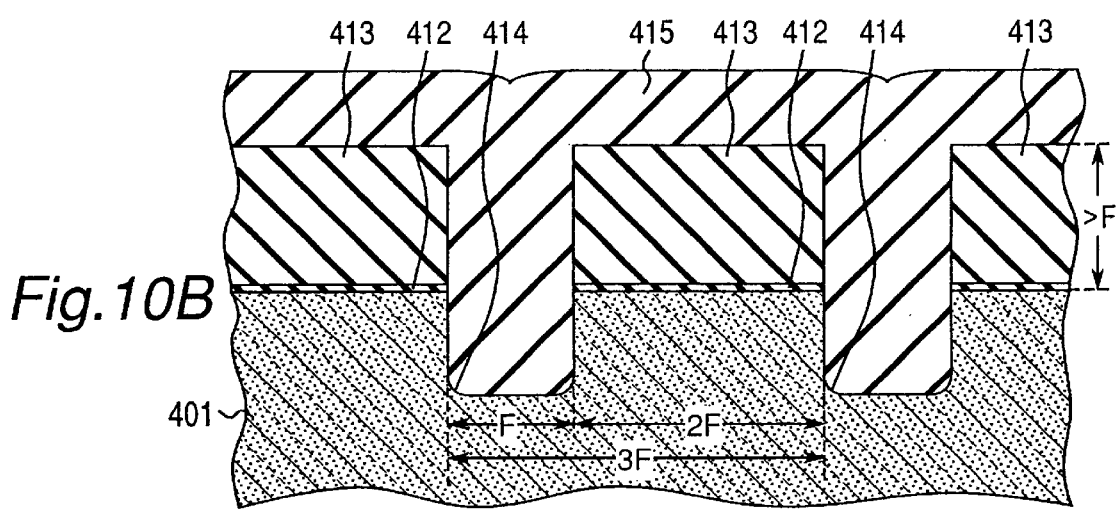
Figure 10C:
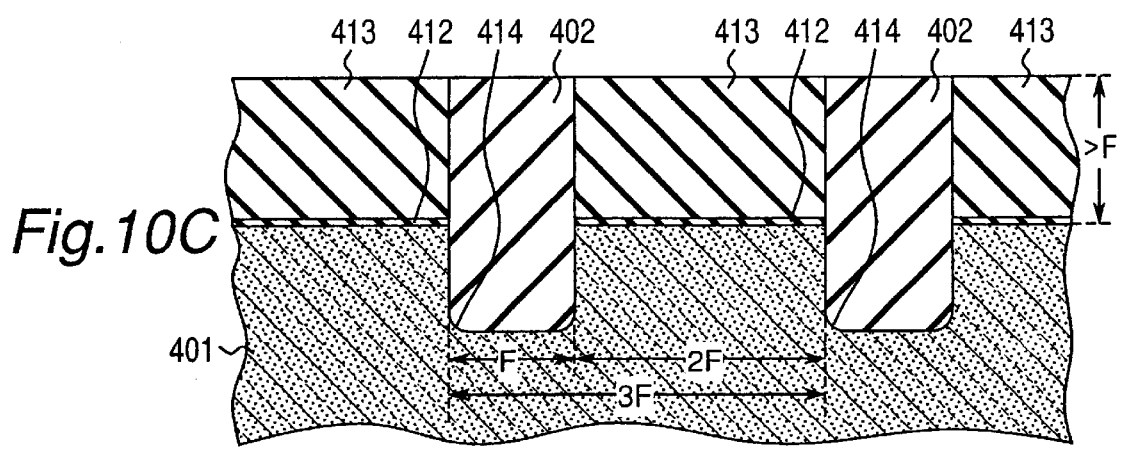

The steps shown in FIGS. 10A–10C are the same as those for the first embodiment. Through the steps, a thick oxide film 415 is embedded in the grooves 414 of trench isolation.

Figure 11D:
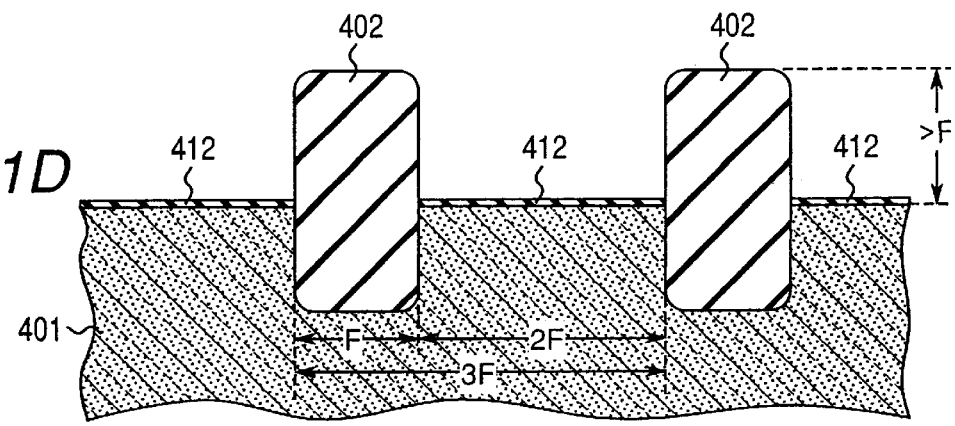

Then, as shown in FIG. 11D, a silicon nitride film 413 is removed by phosphoric acid at an elevated temperature, so that a lower oxide film 412 remains on the semiconductor substrate 401. The lower oxide film 412 is used for a sacrificed oxide film.

It should be noted that, in the case that the thick oxide film 415 or the like is deposited on a bottom surface of the semiconductor substrate 401, the film is removed by using the same step as the first embodiment. Also, in the case that a polycrystalline silicon film is deposited between the lower oxide film 412 and the silicon nitride film 413, the silicon nitride film 413 and the polycrystalline silicon film are removed by using the same step as the first embodiment.

Figure 11E:
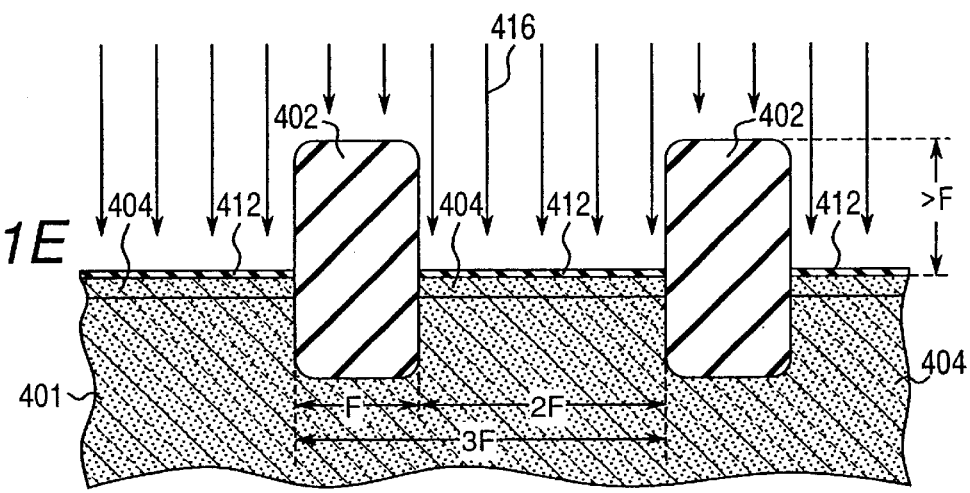

Then, as shown in FIG. 11E, n type impurities 416, for example phosphorus or arsenic, of about $5 \times 10^5 / cm^3$ are implanted into the semiconductor substrate 401 by the well-known ion implantation method using the trench isolation 402 as a mask and through the lower oxide film 412 used for a sacrificed oxide film. Thereby, an $n^+$ diffusing layer 404 is formed. Because the ions are implanted through the lower oxide film 412 used for a sacrificed oxide film, damages of the semiconductor substrate induced by the implanted ions are prevented. This prevents the formation of crystal defects and interface state in the semiconductor substrate 401 in which a channel region will be formed.

Figure 11F:
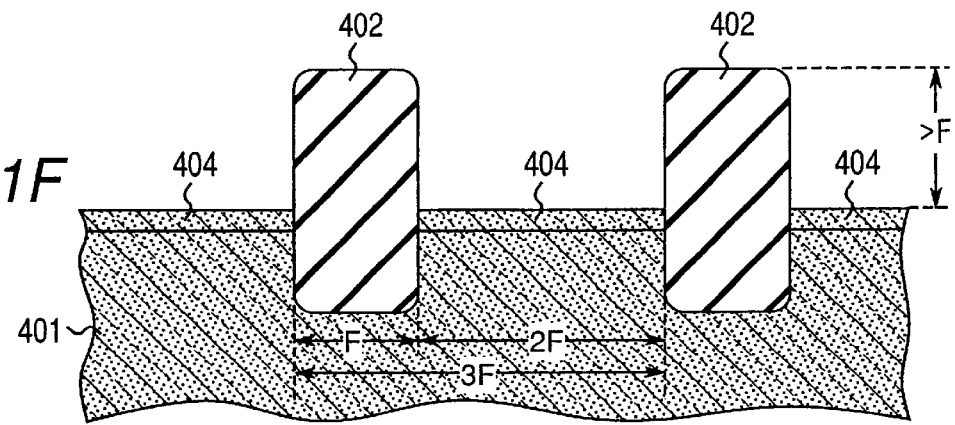

Then, as shown in FIG. 11F, the lower oxide film 412 is removed by using hydrofluoric acid and, thereby, the surface of the semiconductor substrate 401 is exposed. When the lower oxide film is removed by the hydrofluoric acid, the trench isolation 402 is scarcely etched. This is because that the lower oxide film 412 is thin and that the etching time is short. This results in that the distance between the surface of the semiconductor substrate 401 and the top of the trench isolation 402 is scarcely decreased and the distance between them is still more than F.

Figure 12G:
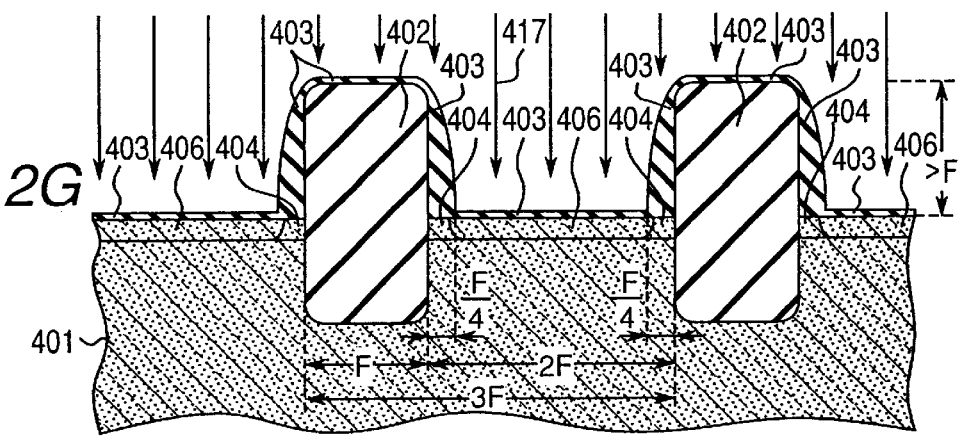

Then, as shown in FIG. 12G, the first oxide film 403 of about F/4 in thickness is deposited on the surface of the semiconductor substrate 401 and also on the surface of the trench isolation 402 by LPCVD method, for example.

Then, the first oxide layer is etched by the dry etching method, so that the first oxide layer 403 of about 200 Å in thickness remains on the semiconductor substrate 401 in which a channel region will be made. This results in that the self-aligned side spacers made from the first oxide film 403 are formed on the side walls of the trench isolations 402.

Then, p type impurities 417, for example boron, of about $4.95 \times 10^{15} / cm^3$ are implanted into the semiconductor substrate 401 using the trench isolation 402 and the side spacers for masks and also through the first oxide film 403 used for a sacrificed oxide film. Thereby, an $n^-$ diffusing layer 406 is formed in an $n^+$ diffusing layer 404. The ions are implanted through the first oxide film 412 for a sacrificed oxide film. This prevents the formation of crystal defects and interface states induced by the damage of the ion implantation in the semiconductor substrate 401.

Figure 12H:
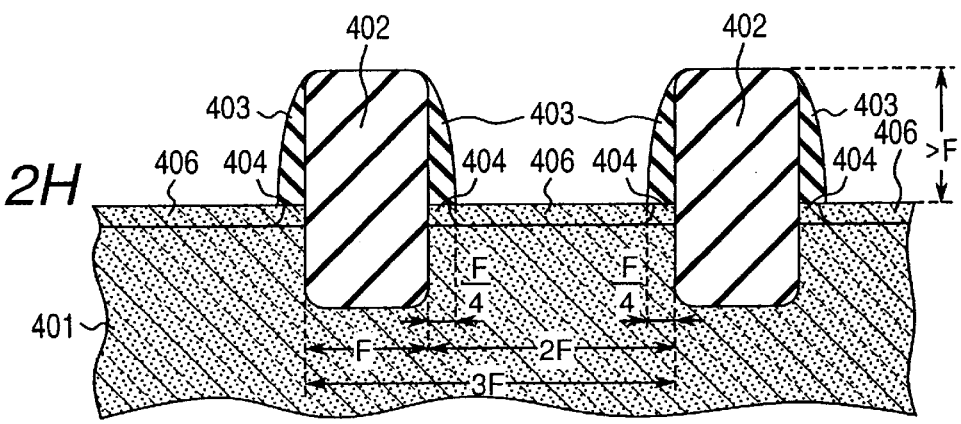

Then, as shown in FIG. 12H, the first oxide film 403 is removed by using hydrofluoric acid. In this case, similar to the step shown in FIG. 11F, the distance between the surface of the semiconductor substrate 401 and the top of the trench isolation 402 is scarcely decreased.

Then, a second oxide film 405 of F/4 in thickness is deposited over the semiconductor substrate 401 by LPCVD method by the same step as that shown in FIG. 12G.

Then, the second oxide layer 405 is etched by the dry etching method, so that the second oxide layer 405 of about 200 Å in thickness remains on the semiconductor substrate 401 in which a channel region will be made. This results in that the self-aligned side spacers made from the second oxide film 405 are formed on the side spacers made from the first oxide film 403.

Then, p type impurities 418, for example boron, of about $6 \times 10^{15} / cm^3$ are implanted into the semiconductor substrate 401 using the trench isolation 402 and the side spacers for masks and also through the second oxide film 405 used for a sacrificed oxide film. This results in that a channel dose region 407 of F in width, which affects to the threshold voltage of a memory cell, is formed between neighboring $n^-$ diffusion layer 406.

Figure 12I:
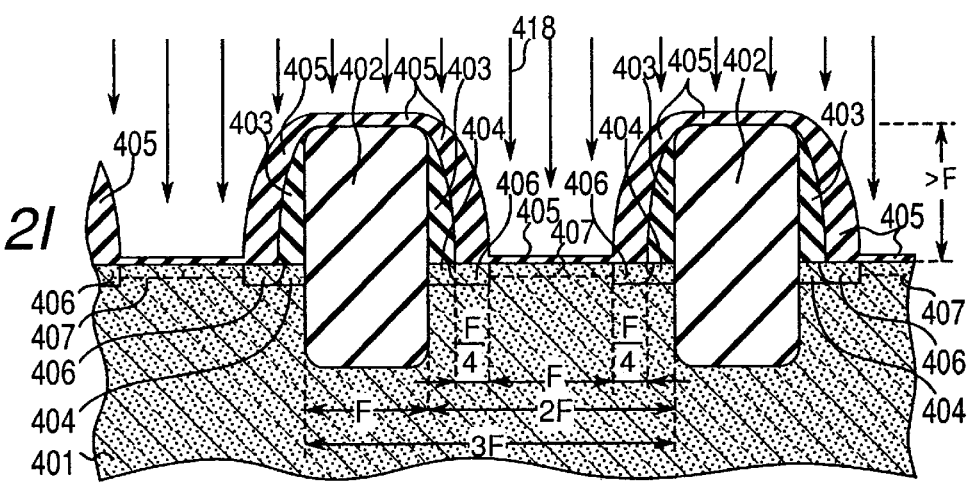

As shown in FIG. 12I, the $n^+$ diffusion layer 404 and $n^-$ diffusion layer 406 at the left side of the trench isolation 402 become a drain line, while those at right side of the trench isolation 402 become a source line.

It should be noted that the $n^+$ diffusion layer 404 and $n^-$ diffusion layer 406 at the left side of the trench isolation 402 may be a source line, while those at right side of the trench isolation 402 may be a drain line.

Similar to the first embodiment, width of the $n^+$ diffusion layer 404 is defined by the self-aligned side spacer of the first oxide film 403, while width of the n diffusion layer 406 is defined by the second oxide film 405. Therefore, the width of the source and drain lines are substantially equal to each other. This results in that the each line has a certain resistance and, therefore, this prevents the malfunction of a memory cell caused by the difference of the resistance between the source and drain lines.

Figure 13J:
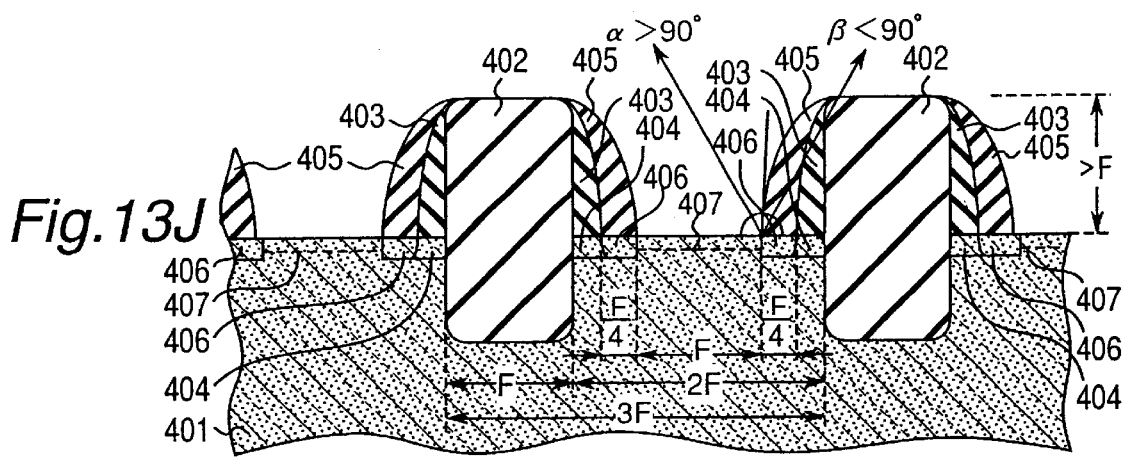

Then, as shown in FIG. 13J, the second oxide film 405 is removed by the hydrofluoric acid, and the distance between the surface of the semiconductor substrate 401 and the top of the trench isolation 402 is scarcely decreased.

Figure 13K:
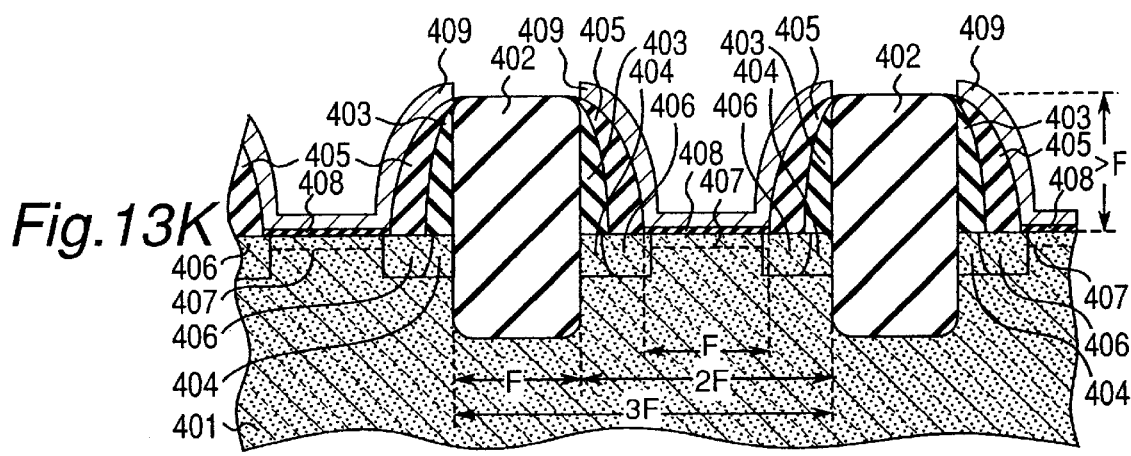

Then, as shown in FIG. 13K, similar to the first embodiment, a tunnel film 408 of 100 Å or less in thickness is formed on the surface of the semiconductor substrate 401, in which a channel region will be formed. Also, a polycrystalline silicon layer is deposited over the semiconductor substrate 401 and is pattered to form a floating gate electrode 409.

Figure 13L:
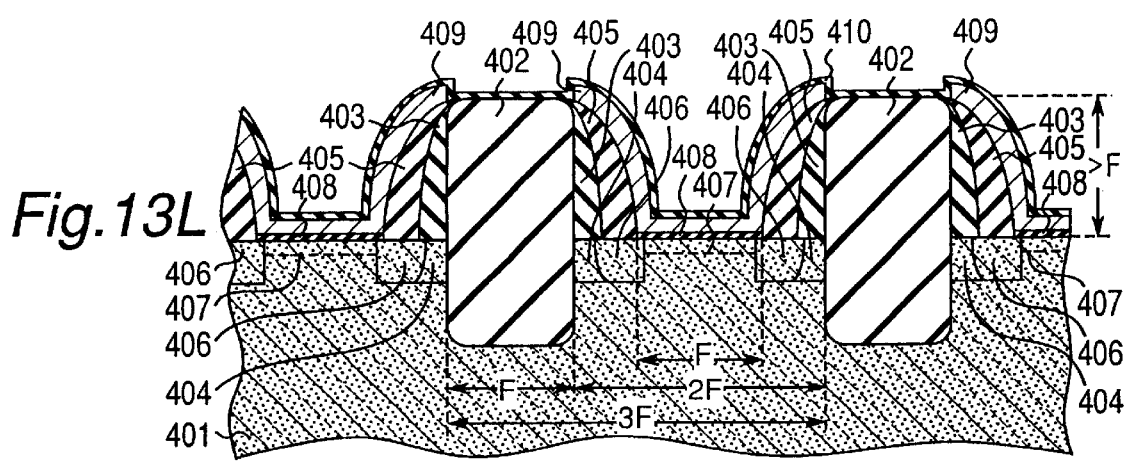

Then, as shown in FIG. 13L, an inter poly insulating film 410 is formed over the semiconductor substrate 401.

Figure 14M:
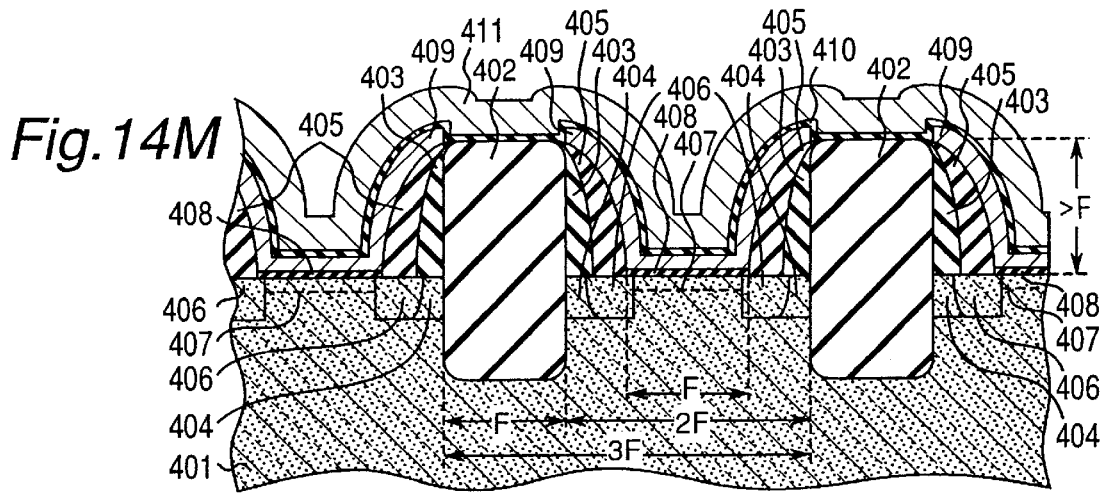
Figure 14N:
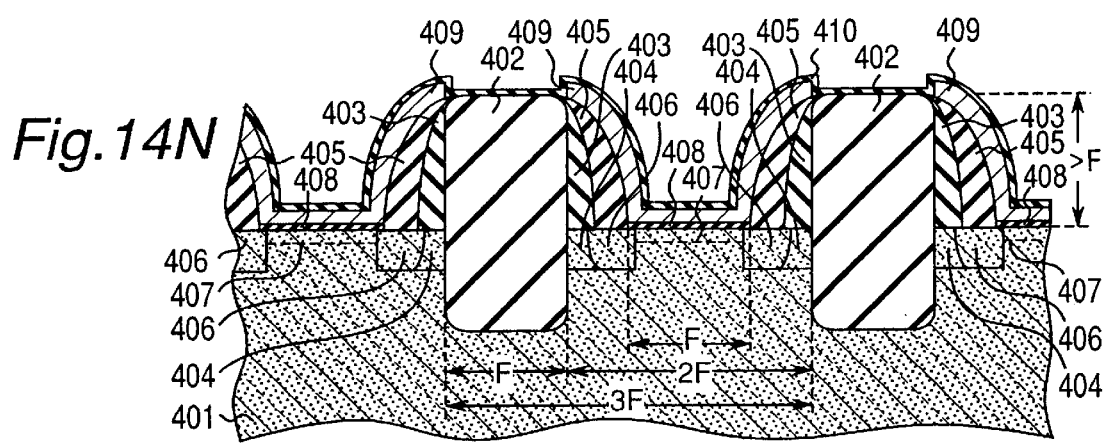
Figure 14O:
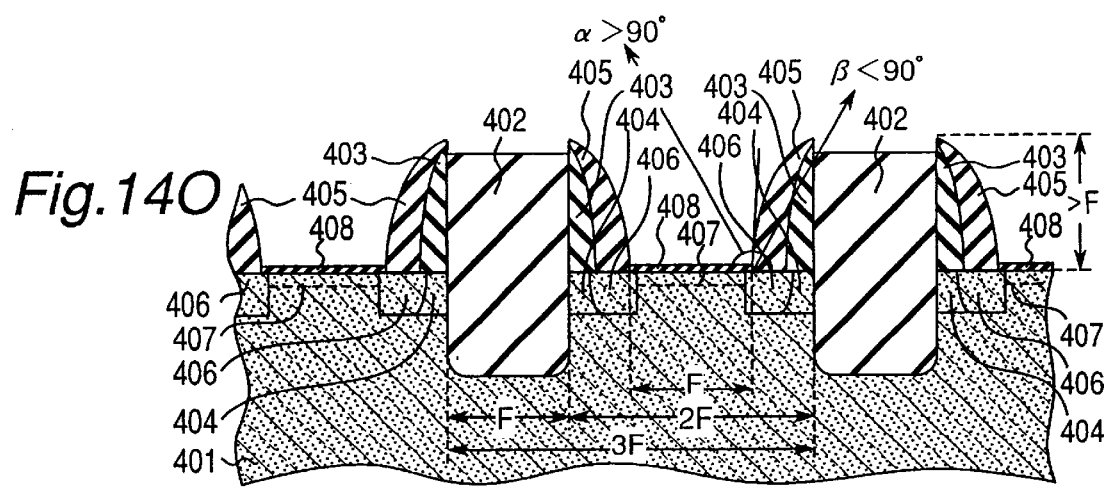

Then, as shown in FIGS. 14M, 14N and 14O, the steps similar to those of the first embodiment are performed and, thereby a region with a word line (see FIG. 14M) and a region without a word line (see FIG. 14O) of the non-volatile semiconductor memory device are completed.

Similar to the first embodiment, by using the method of this embodiment, formation of an etching residue in the etching step shown in FIG. 14O is prevented. This results in that the reliability of several hundred millions of memory cells can be increased, so that a non-volatile semiconductor memory device having high reliability can be obtained.

Figure 15A:
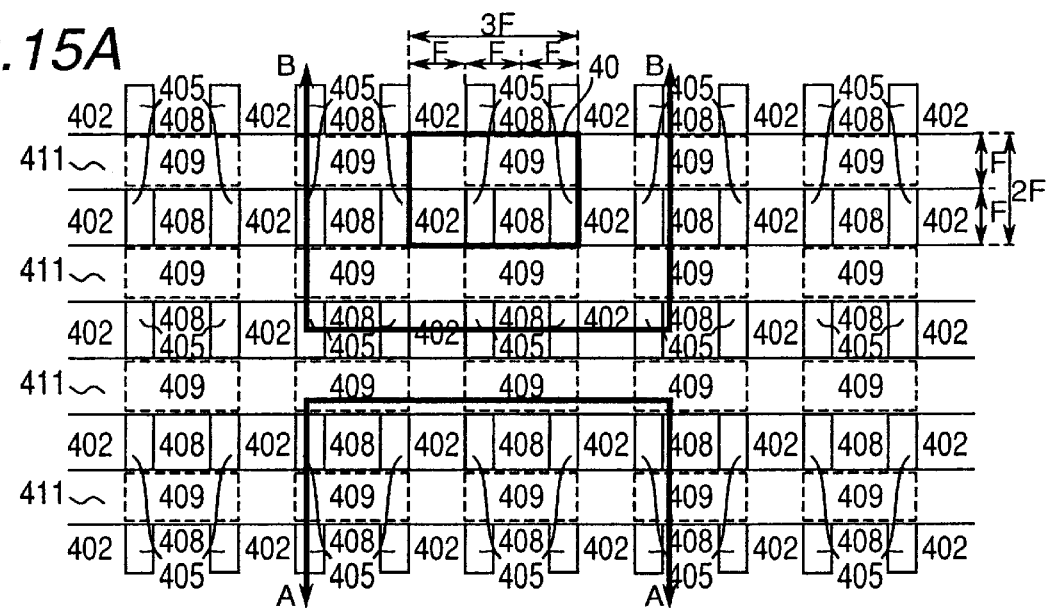
FIG. 15A is a plan view of a non-volatile semiconductor memory device according to the second embodiment of the present invention.
Figure 15B:
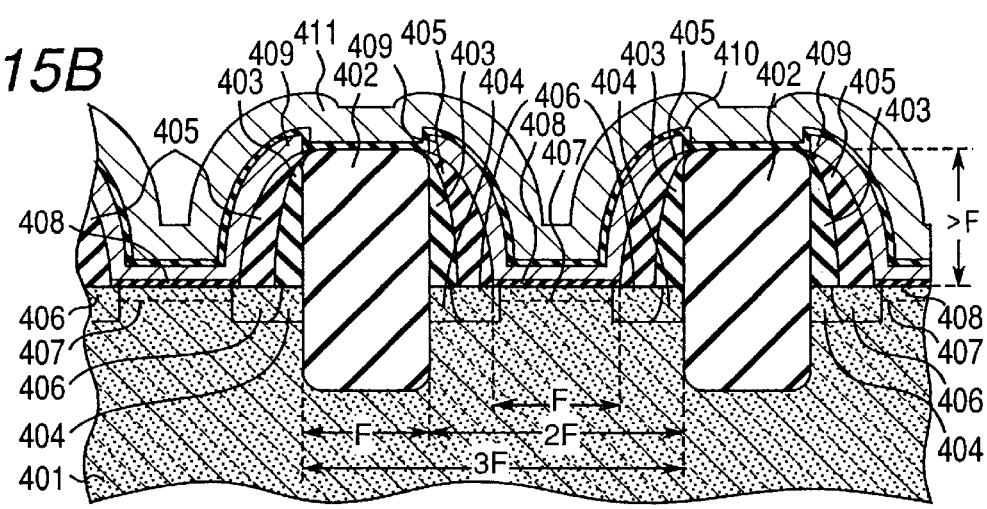
FIG. 15B is a cross sectional view along lines A—A of FIG. 15A.
Figure 15C:
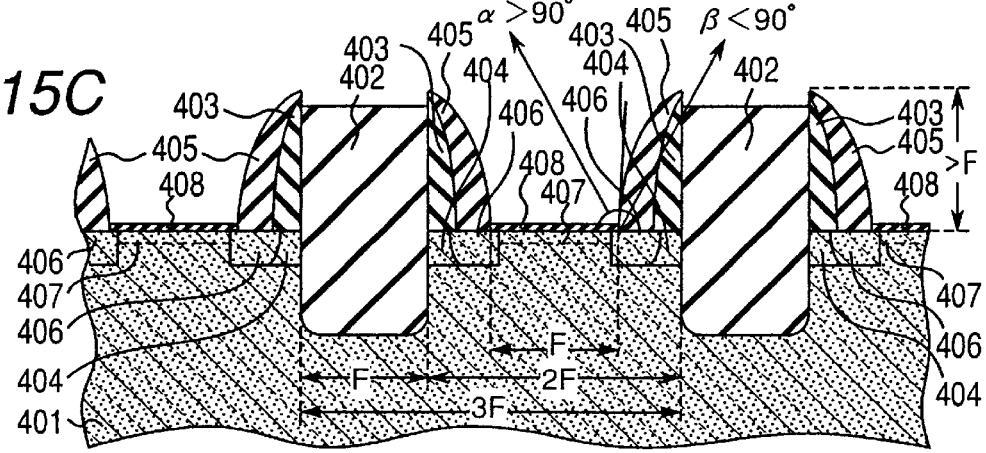
FIG. 15C is a cross sectional view along lines B—B of FIG. 15A.
Figure 16A:
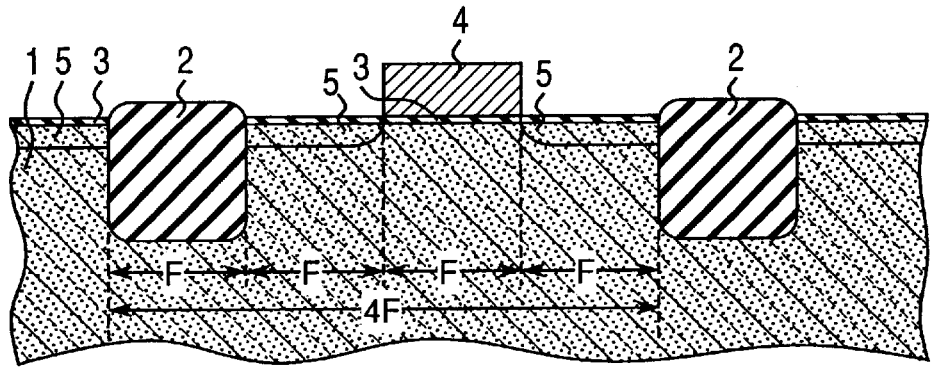
FIGS. 16A–18I are cross sectional views of a conventional non-volatile semiconductor memory device.
Figure 16B:
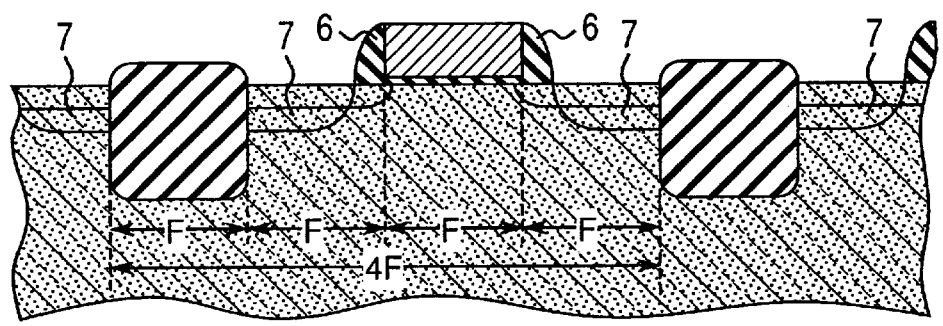
Figure 16C:
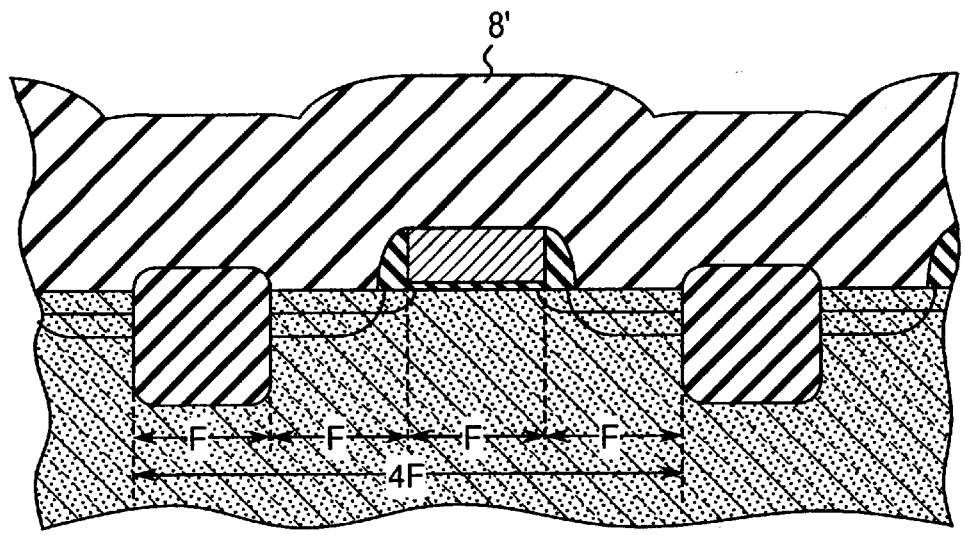
Figure 17D:
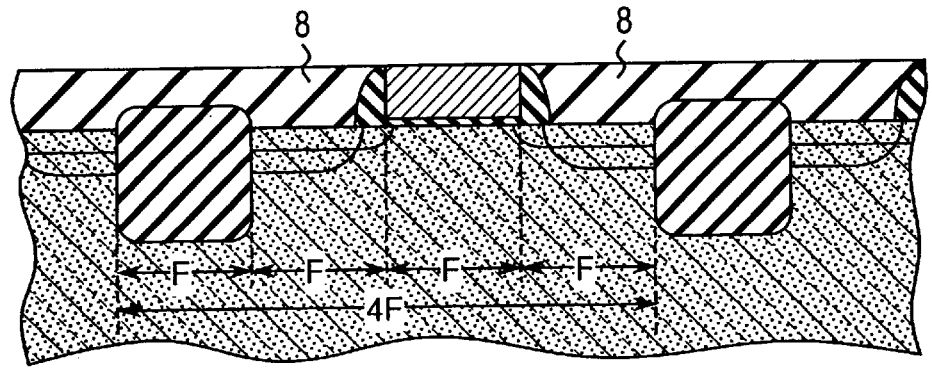
Figure 17E:
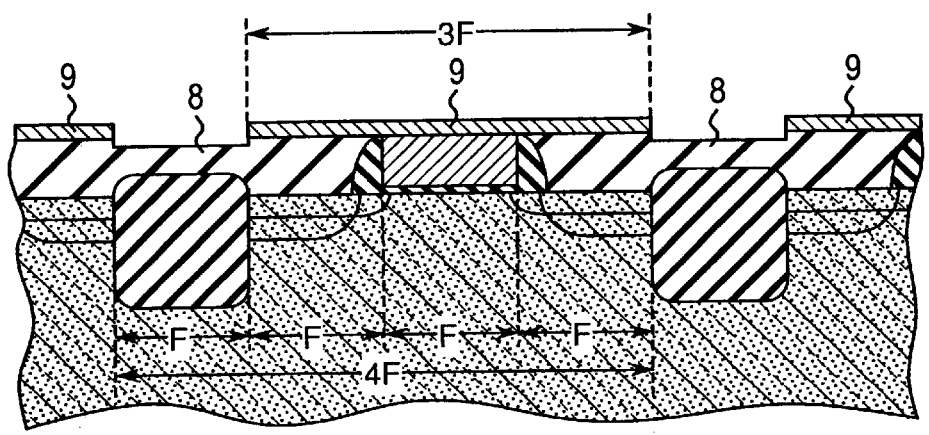
Figure 17F:
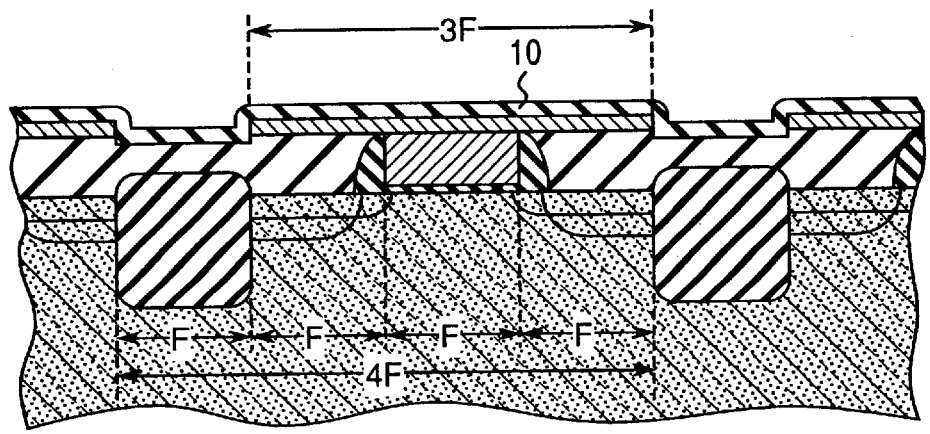

FIG. 15A is a plan view of the non-volatile semiconductor memory device of this embodiment. FIG. 15B is a cross sectional view along lines A—A of FIG. 15A, that is a cross sectional view of the word line region. While, FIG. 15C is a cross sectional view along lines B—B of FIG. 15A, that is a cross sectional view of the no word line region.

Also, in the non-volatile semiconductor memory device of this embodiment, similar to the first embodiment, the area of a memory cell 40 becomes 6 $F^2$ which is smaller than that of the conventional memory cell 8 $F^2$. This results in that the non-volatile semiconductor memory device which is highly integrated than the conventional memory device can be obtained.

It should be noted that the principle of operation of the non-volatile semiconductor memory device of this embodiment is similar to that of the first embodiment.

What is claimed is:

1. A non-volatile semiconductor memory device, comprising:
   a semiconductor substrate having a surface;
   trench isolations formed substantially parallel to each other and projected from the surface;
   self-aligned side spacers formed on the side walls of the trench isolations;
   source and drain regions formed in the semiconductor substrate below the side spacers;
   a channel region formed in the semiconductor substrate between the source and drain regions; and
   a floating gate electrode formed on the channel region through a tunnel film, wherein the distance between the neighboring trench isolations is about twice of the gate length of the floating gate electrode.

2. A device according to claim 1, wherein the source and drain regions are formed by diffusing impurities from the side spacers into the semiconductor substrate under the side spacers.

3. A device according to claim 1, wherein the source and drain regions are formed from regions of the semiconductor substrate which are covered with the side spacers during the ion implantation process using the side spacers for masks.

4. A device according to claim 1, wherein each of the source and drain regions comprises a first region adjacent to the trench isolation and a second region, the concentration of impurities in the second region being lower than that of the first region.

5. A device according to claim 1, wherein the thickness of the tunnel film is substantially constant.

6. A device according to claim 1, wherein the width of the side spacers are substantially constant.

7. A device according to claim 1, wherein the width of the source region is substantially equal to that of the drain region.

8. A device according to claim 1, wherein the distance between the surface of the semiconductor substrate and a top of the trench isolation is substantially equal to the gate length of the floating gate electrode.

9. A device according to claim 1, wherein the floating gate is formed to cover a side wall of the trench isolation.

10. A non-volatile semiconductor memory device, comprising:
    a semiconductor substrate having a surface;
    trench isolations formed substantially parallel to each other and projected from the surface;
    self-aligned side spacers formed on the side walls of the trench isolations;
    source and drain regions formed in the semiconductor substrate below the side spacers;
    a channel region formed in the semiconductor substrate between the source and drain regions; and
    a floating gate electrode formed on the channel region through a tunnel film wherein the distance between the surface of the semiconductor substrate and a top of the trench isolation is substantially equal to the gate length of the floating gate electrode.

11. A device according to claim 10, wherein the distance between the neighboring trench isolations is about twice of the gate length of the floating gate electrode.

12. A device according to claim 10, wherein the source and drain regions are formed by diffusing impurities from the side spacers into the semiconductor substrate under the side spacers.

13. A device according to claim 10, wherein the source and drain regions are formed from regions of the semiconductor substrate which are covered with the side spacers during the ion implantation process using the side spacers for masks.

14. A device according to claim 10, wherein each of the source and drain regions comprises a first region adjacent to the trench isolation and a second region, the concentration of impurities in the second region being lower than that of the first region.

15. A device according to claim 10, wherein the thickness of the tunnel film is substantially constant.

16. A device according to claim 10, wherein the width of the side spacers are substantially constant.

17. A device according to claim 10, wherein the width of the source region is substantially equal to that of the drain region.

18. A device according to claim 10, wherein the floating gate is formed to cover a sidewall of the trench isolation.

* * * * *

UNITED STATES PATENT AND TRADEMARK OFFICE
CERTIFICATE OF CORRECTION

PATENT NO.   : 6,459,121 B1                                             Page 1 of 1
DATED        : October 1, 2002
INVENTOR(S)  : Osamu Sakamoto et al.

It is certified that error appears in the above-identified patent and that said Letters Patent is hereby corrected as shown below:

<u>Title page,</u>
Item [54], after "PRODUCING" change "NON-VIOLATILE" to
-- NON-VOLATILE --

Signed and Sealed this

Eleventh Day of March, 2003

JAMES E. ROGAN
*Director of the United States Patent and Trademark Office*